US008283717B2

(12) United States Patent
Matsunami et al.

(10) Patent No.: US 8,283,717 B2
(45) Date of Patent: Oct. 9, 2012

(54) SEMICONDUCTOR STORAGE DEVICE

(75) Inventors: Junya Matsunami, Yokohama (JP);
Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 220 days.

(21) Appl. No.: 12/886,225

(22) Filed: Sep. 20, 2010

(65) Prior Publication Data

US 2011/0108901 A1 May 12, 2011

(30) Foreign Application Priority Data

Nov. 9, 2009 (JP) ................................. 2009-256366

(51) Int. Cl.
*H01L 29/788* (2006.01)
*H01L 21/336* (2006.01)
*H01L 21/22* (2006.01)
*H01L 21/38* (2006.01)

(52) U.S. Cl. ......... 257/315; 257/E27.085; 257/E21.662; 438/258; 438/554

(58) Field of Classification Search .................. 257/315, 257/E27.085, E21.662; 438/258, 554
See application file for complete search history.

(56) References Cited

U.S. PATENT DOCUMENTS

| 5,086,008 | A | * | 2/1992 | Riva | 438/201 |
| 6,376,341 | B1 | * | 4/2002 | Kluth et al. | 438/510 |
| 6,613,659 | B2 | * | 9/2003 | Kikuchi et al. | 438/591 |
| 6,656,800 | B2 | | 12/2003 | Arai | |
| 7,354,824 | B2 | * | 4/2008 | Lin et al. | 438/257 |
| 7,518,915 | B2 | | 4/2009 | Noguchi | |
| 7,790,568 | B2 | * | 9/2010 | Okamura | 438/434 |
| 2004/0266111 | A1 | * | 12/2004 | Lee | 438/264 |
| 2008/0160698 | A1 | | 7/2008 | Lee | |
| 2009/0159961 | A1 | | 6/2009 | Kato et al. | |

FOREIGN PATENT DOCUMENTS

| JP | 2003-297950 | 10/2003 |
| JP | 2004-266041 | 9/2004 |
| JP | 2008-166747 | 7/2008 |

OTHER PUBLICATIONS

U.S. Appl. No. 12/724,802, filed Mar. 16, 2010, Yoshiko Kato et al.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

Device isolation/insulation films each have a first height within a first area and a second height higher than the first height within a second area. At least the device isolation/insulation films adjacent to a contact diffusion region exist in the second area, and the device isolation/insulation films adjacent to memory transistors exist in the first area. The device isolation/insulation films are implanted with an impurity of a first conductivity type, and device formation regions each have a diffusion region of the first conductivity type, the diffusion region being formed by diffusion of the impurity of the first conductivity type from the device isolation/insulation films.

19 Claims, 29 Drawing Sheets

→ Bit-Line Direction

→ Word-Line Direction

SEMICONDUCTOR STORAGE DEVICE

CROSS REFERENCE TO RELATED APPLICATIONS

This application is based on and claims the benefit of priority from prior Japanese Patent Application No.2009-256366, filed on Nov. 9, 2009, the entire contents of which are incorporated herein by reference.

1. Field

Embodiments described herein relate generally to a semiconductor storage device.

2. Background

Recently, semiconductor storage devices such as NAND-type flash memory are implemented on many electronics. Then, the semiconductor storage devices are required to have more and more storage capacity and smaller and smaller storage elements correspondingly.

Taking NAND-type flash memory as an example, it commonly uses memory transistors with a MOSFET structure having laminated floating and control gates. The NAND-type flash memory includes a NAND cell unit having a plurality of such memory transistors connected in series. Each NAND cell unit has one end connected to a bit line via a select gate transistor, and also has the other end connected to a source line via a select gate transistor.

For memory with such MOSFET structures, impurities are implanted into the channel parts in order to adjust cut-off characteristics. For memory transistors of n-type MOSFETs, p-type impurities such as boron (B) are implanted into the channel parts. As miniaturization advances, however, it is difficult to reduce variation in cut-off characteristics of memory cell transistors. Furthermore, it is preferable for select gate transistors to keep junction leakage to the semiconductor substrate as low as possible.

DETAILED DESCRIPTION

Figure 1:
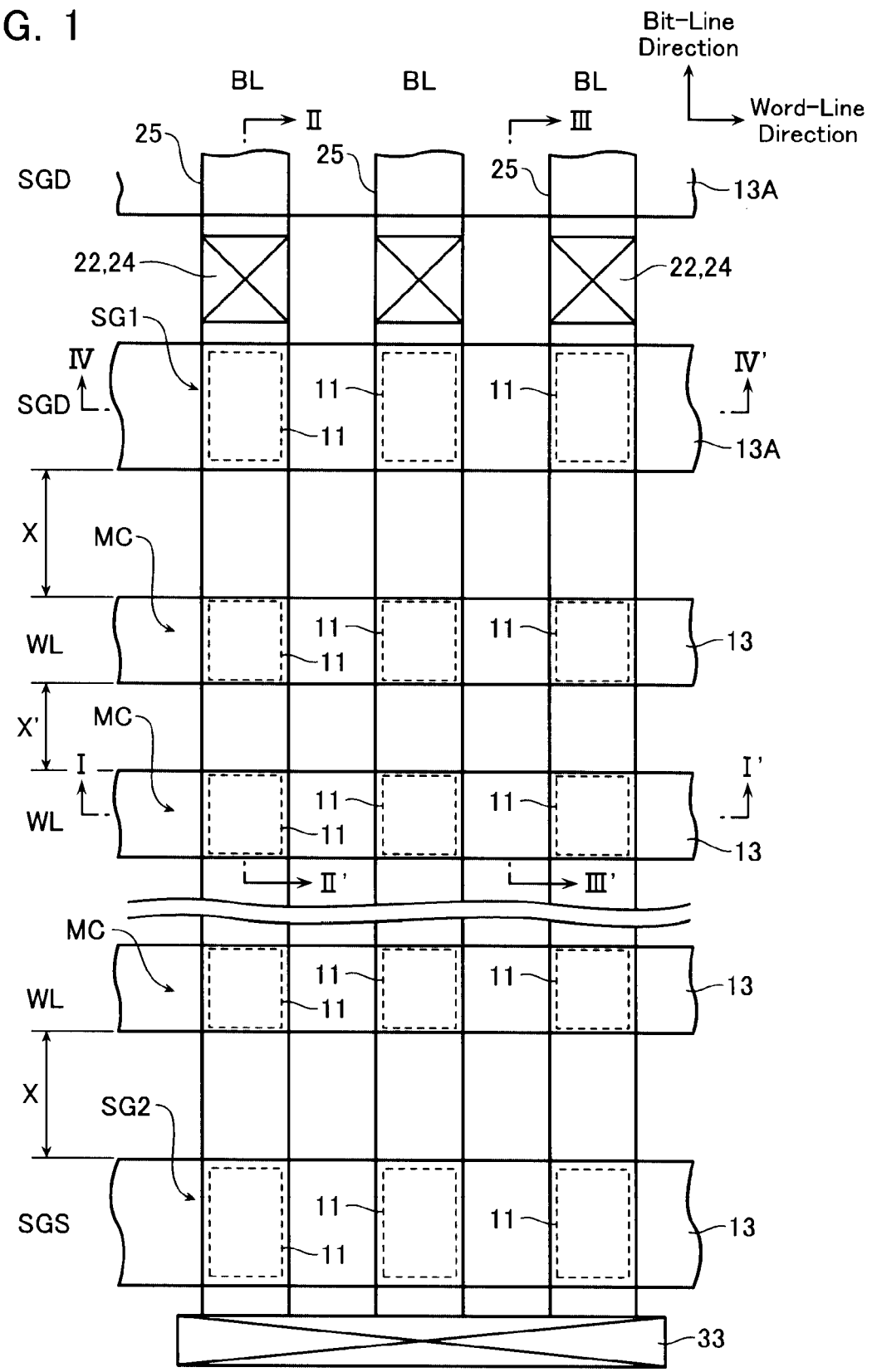
FIG. 1 illustrates a schematic layout of a memory cell array of NAND-type flash memory according to a first embodiment of the present invention.

According to one aspect, a non-volatile semiconductor storage device comprises: a semiconductor substrate; a semiconductor layer formed on the semiconductor substrate;

device isolation/insulation films formed in the semiconductor layer along a first direction as its longitudinal direction; and device formation regions formed to separate the semiconductor layer with the device isolation/insulation films along the first direction as its longitudinal direction.

The device formation regions have a memory string, a select gate transistor, and a contact diffusion region formed thereon, the memory string including a plurality of memory transistors connected in series, the select gate transistor having one end connected to the memory string, and the contact diffusion region being connected to the other end of the select gate transistor and in contact with a contact at its surface.

The device isolation/insulation films each have a first height within a first area and a second height higher than the first height within a second area. At least the device isolation/insulation films adjacent to the contact diffusion region exist in the second area, and the device isolation/insulation films adjacent to the memory transistors exist in the first area. The device isolation/insulation films are implanted with an impurity of a first conductivity type, and the device formation regions each have a diffusion region of the first conductivity type.

An impurity concentration of the impurity of the first conductivity type in the device formation regions adjacent to the device isolation/insulation films in the second area is lower than an impurity concentration of a first impurity in the diffusion regions of the first conductivity type formed in the device formation regions adjacent to the device isolation/insulation films in the first area.

According to another aspect, a method of manufacturing a non-volatile semiconductor storage device is provided. The non-volatile semiconductor storage device comprises: on a device formation region, a memory string including a plurality of memory transistors connected in series, a select gate transistor having one end connected to one end of the memory string, and a contact diffusion region connected to the other end of the select gate transistor and in contact with a contact. In this method, a semiconductor layer is formed on a semiconductor substrate to form the plurality of memory transistors thereon. Then, trenches are formed in the semiconductor layer along a first direction as its longitudinal direction, and device isolation/insulation films are formed within the trenches to separate the semiconductor layer into a plurality of device formation regions with the device isolation/insulation films. Additionally, at least a region where the contact diffusion region is to be formed is covered with a mask, and the device isolation/insulation films are etched back using the mask. Thereafter, an impurity is implanted into the device isolation/insulation films using the mask. Furthermore, the impurity is diffused from the device isolation/insulation films toward the device formation regions through a thermal process.

Embodiments of the present invention will now be described in detail below with reference to the accompanying drawings.

[First Embodiment]

FIG. 1 illustrates a schematic layout of a memory cell array of NAND-type flash memory according to a first embodiment of the present invention. Word lines (WL) 13 and bit lines (BL) 25 are disposed intersecting one another, and memory cells MC are formed at respective intersections therebetween. Each memory cell transistor includes a memory cell MC and source/drain diffusion layers (indicated by 15 in FIG. 3) sandwiching the memory cell MC therebetween in the bit-line direction. As described below, a plurality of memory cells MC that are aligned in the bit-line direction have diffusion layers of memory cell transistors commonly connected to provide a memory string. One end of each memory string is connected to a bit line BL via a drain-side select gate transistor SG1. A bit line BL and a drain-side select gate transistor SG1 are connected with each other via contacts 22 and 24. In addition, the other end of each NAND cell unit is connected to a source line SL (not illustrated) via a source-side select gate transistor SG2. The source line SL and the source-side select gate transistor SG2 are connected with each other via a source-side contact 33.

The gate of the drain-side select gate transistor SG1 is connected to a drain-side select gate line (SGD) 13A disposed parallel to the word lines WL. In addition, the gate of the source-side select gate transistor SG2 is connected to a source-side select gate line (SGS) 13B disposed parallel to the word lines WL. Wherein, a direction in which the word lines extend represents the word-line direction and another in which the bit lines BL extend represents the bit-line direction. A width X between a word line 13 and a select gate line 13A or 13B in the bit-line direction is set to be wider than a width X' between word lines 13.

Figure 2:
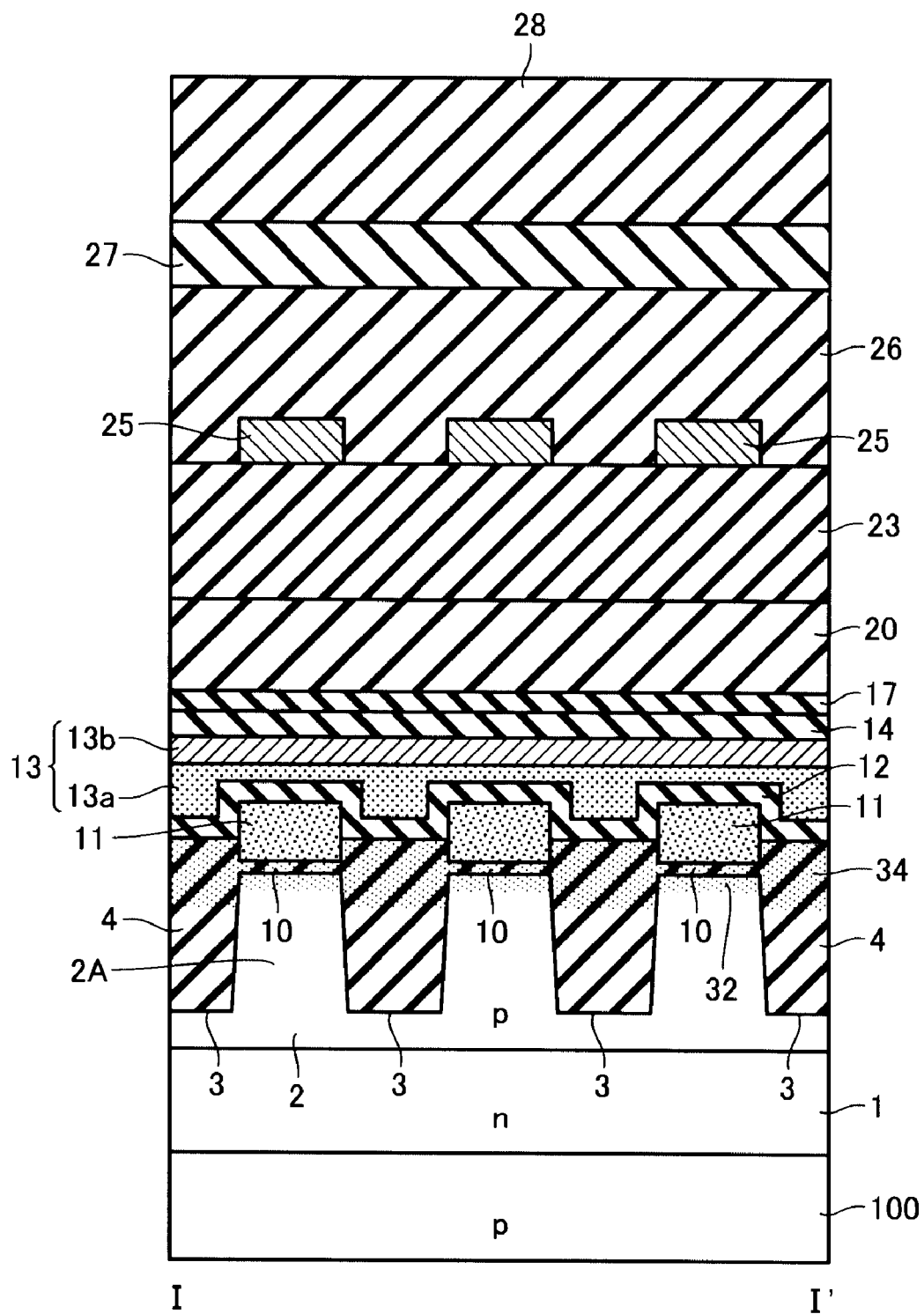
FIG. 2 is a cross-sectional view taken along line I-I' along a word line WL of FIG. 1.
Figure 3:
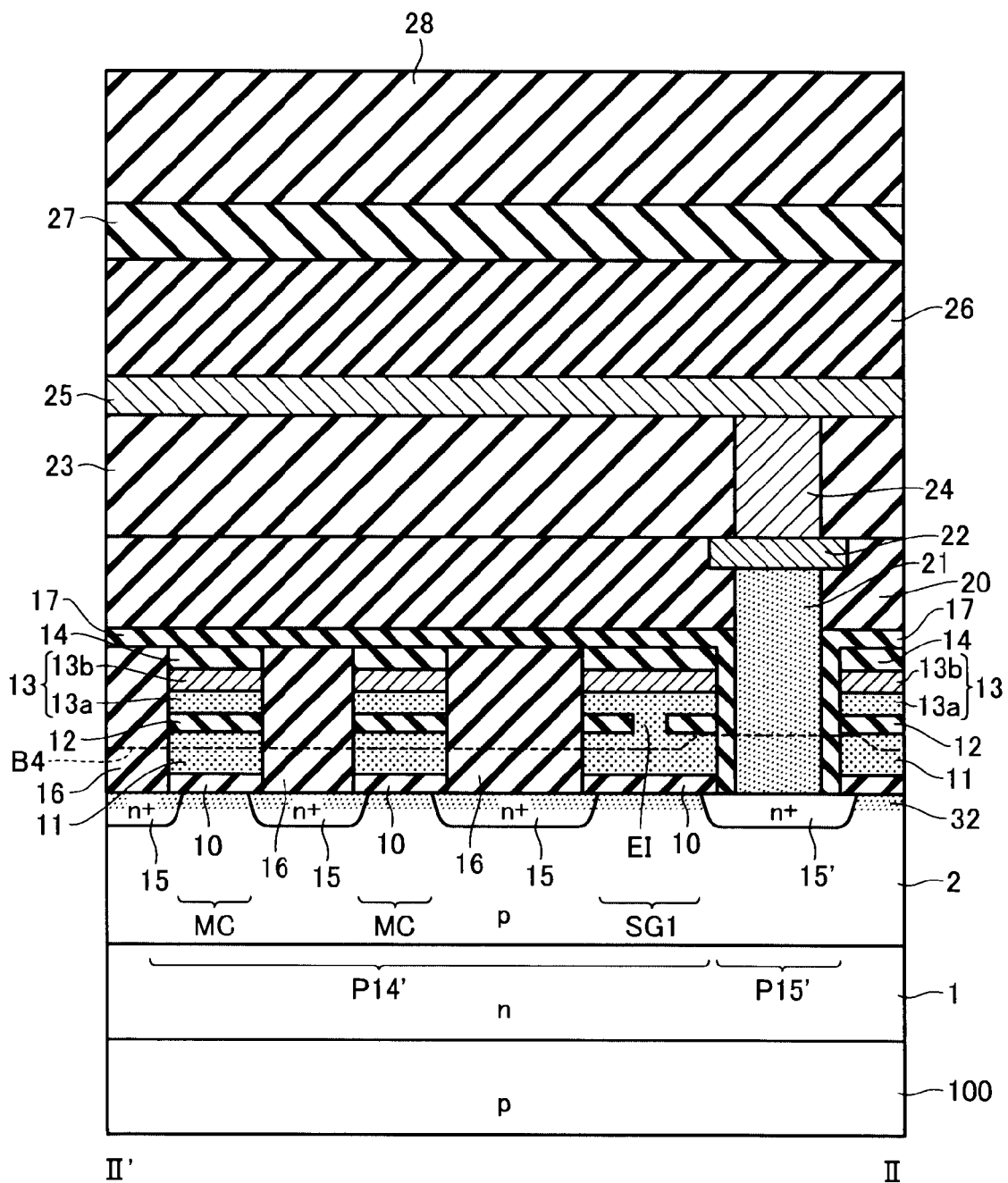
FIG. 3 is a cross-sectional view taken along line II-II' along a bit line BL of FIG. 1.

FIG. 2 is a cross-sectional view taken along line I-I' along a word line WL of FIG. 1; and FIG. 3 is also a cross-sectional view taken along line II-II' along a bit line BL of FIG. 1. As illustrated in FIG. 2, an n-type well 1 and a p-type well 2 are formed in a cell array area on a p-type silicon substrate 100. The p-type well 2 has trenches 3 formed therein at regular intervals, in which trenches device isolation/insulation films 4 are disposed. Memory cells MC are formed at those portions of the p-type well 2 that are sandwiched between the device isolation/insulation films 4. That is, those portions of the p-type well 2 sandwiched between the device isolation/insulation films 4 function as device formation regions 2A on which memory cells MC corresponding to memory transistors, select gate transistors SG1, SG2 and so on are disposed.

Note that p-type impurities such as boron (B) are implanted into the device isolation/insulation films 4 (as indicated by 34). In addition to boron, boron fluoride, boron difluoride, gallium (Ga), indium (In) and so on may be employed as p-type impurities. The following description will be made taking boron (B) as an example. Of course, any other p-type impurities instead of boron are well within the scope of the present invention.

In addition, boron (B) is also diffused from the device isolation/insulation films 4 into the surface parts of the device formation regions 2A, whereby diffusion regions 32 are formed. The impurity concentration of boron in the device isolation/insulation films 4 is higher than that in the diffusion regions 32 of the device formation regions 2A. This is because the boron in the diffusion regions 32 is diffused from the device isolation/insulation films 4.

Referring now to FIG. 3, a configuration of memory cells MC and a memory string will be described below. Floating gates 11 of polysilicon films are disposed on the device formation regions 2A via tunnel oxide films 10. Control gates 13 are formed on the floating gates 11 via intergate insulation films 12 (e.g., ONO films). Each control gate 13 is disposed by a lamination film of a polysilicon film 13a and a silicide film 13b, such as, e.g., tungsten silicide, nickel silicide, or cobalt silicide. Each control gate 13 is continuously patterned in the word-line direction to provide a word line WL. Note that the same floating gate 11 and control gate 13 are disposed in a select gate transistor SG1. That is, the select gate transistor SG1 has a gate electrode disposed in the same layer as a floating gate 11, another gate electrode disposed in the same layer as a control gate 13, and an intergate insulation film sandwiched between these gate electrodes. However, a part of the intergate insulation film 12 is removed by etching to form an aperture EI in the select gate transistor SG1. Through this aperture EI, the floating gate 11 and the control gate 13 are brought into a short-circuited state. Although not illustrated in FIG. 3, the select gate transistor SG2 also has the same configuration.

The control gates 13 and the floating gates 11 are patterned concurrently using silicon nitride films (SiN films) 14 as masks. Then, implantation of n-type impurity ions is carried out using the patterned gates as masks to form n-type source/drain diffusion regions 15. Each diffusion layer 15 is shared by the adjacent memory cell transistors to form a memory string including a plurality of memory cells MC connected in series. Then, select gate transistors SG1 and SG2 are each connected to an end of the memory string to form a NAND cell unit. Drain contact diffusion regions 15' are formed on the surfaces of the n-type device formation regions 2A on the side of the select gate transistors SG1 and SG2 opposite to the memory cell transistor side.

In addition, p-type diffusion regions 32 are formed on the surfaces of the device formation regions 2A where memory cells MC are disposed, including those regions where diffusion regions 15 are formed (but excluding those positions where drain contact diffusion regions 15' are formed). Furthermore, gaps between a plurality of floating gates and control gates 13 are filled with interlayer insulation films 16, and an SiN film 17 is further deposited over memory cell strings.

The memory cell array is overlaid with an interlayer insulation film 20. A contact plug 21 and a wiring 22 of, e.g., tungsten, as the first layer metal are embedded in the interlayer insulation film 20. The bottom surface of the contact plug 21 is connected to the n-type drain contact diffusion region 15'. Furthermore, an interlayer insulation film 23 is laminated on the interlayer insulation film 20. A contact plug 24 is embedded in the interlayer insulation film 23, and a bit line (BL) 25 of, e.g., an Al or Cu film is formed thereon. Although FIG. 3 only illustrates the contact part at the bit line side, and the wiring 22 is illustrated to provide a relay wiring for the bit line, the source line SL is also formed by the same film as the wiring 22.

A silicon oxide film 26 as well as an SiN film 27 and a polyimide film 28 formed by plasma CVD are deposited on the bit line 25 as passivation films. Note that the broken line B4 of FIG. 3 indicates the surface position of an interlayer insulation film 4 at section III-III', which will be discussed later.

Figure 4A:
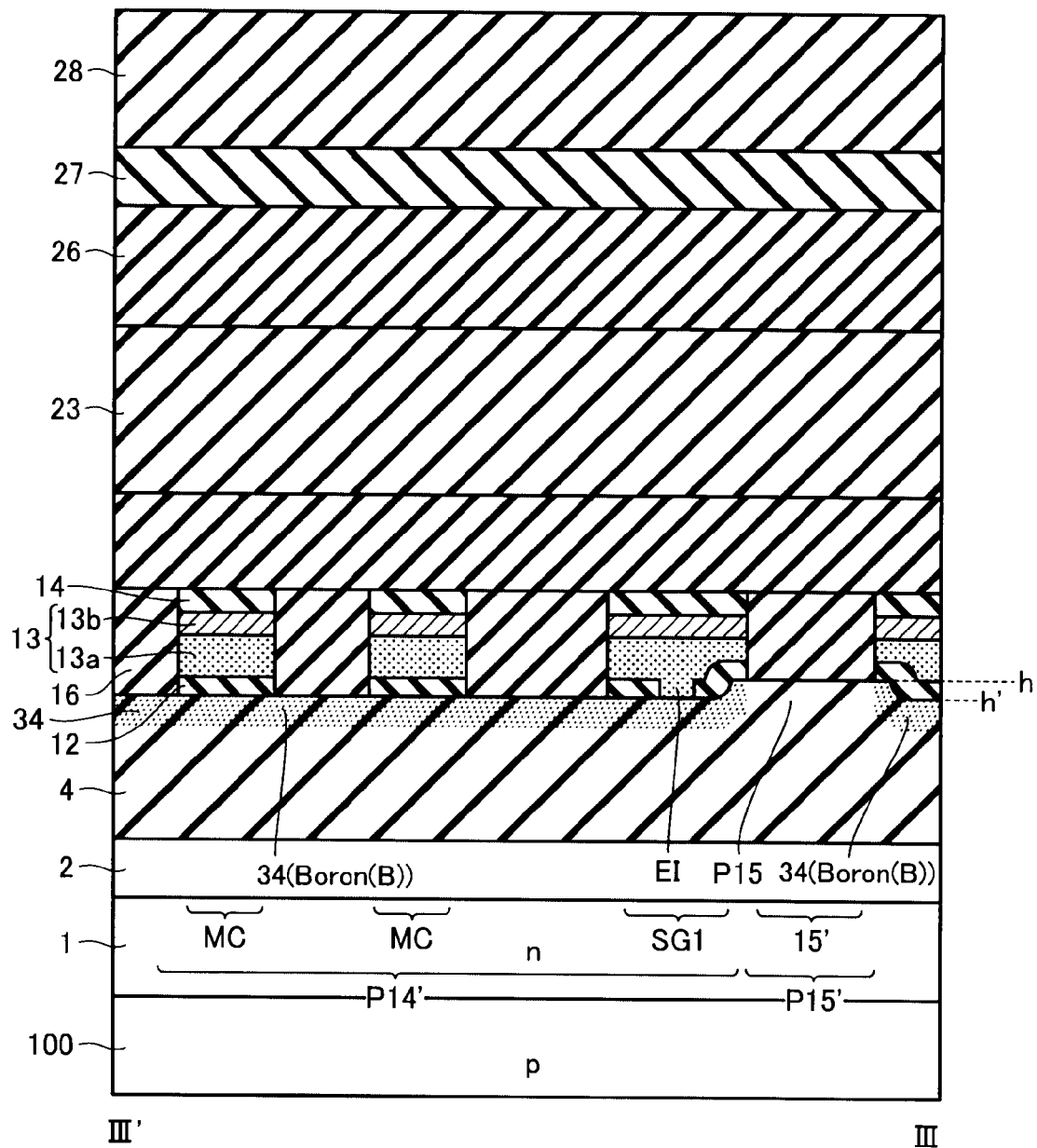
FIG. 4A is a cross-sectional view taken along line III-III' of FIG. 1.

FIG. 4A is a cross-sectional view taken along III-III' of FIG. 1. In this section III-III', the intergate insulation films 12, the polysilicon films 13a and the silicide films 13b providing the control gates 13, as well as the silicon nitride films 14 are formed to extend continuously from the section II-II' in the vertical direction to the drawing sheet of FIG. 4A. In the device isolation/insulation film 4, boron (B) is not diffused within an area P15' where a drain contact diffusion region 15' is formed adjacently in the vertical direction to the drawing sheet (i.e., at those positions in the device isolation/insulation film 4 that are adjacent to the drain contact diffusion region 15' (a second area)). Moreover, the device isolation/insulation film 4 has a surface position h within the area P15' (the second area) that is higher than a surface position h' of the device isolation/insulation film 4 in another area P14' (a first area) (see FIG. 4A). That is, the device isolation/insulation film 4 is not etched back within the area P15' due to formation of a mask M, which will be discussed later. Furthermore, boron (B) is not implanted due to the presence of the mask M. Wherein, the position h represents the highest position of the top surface of the device isolation/insulation film 4 within the area P15', and the position h' represents the position of boundary between the intergate insulation film 12 and the device isolation/insulation film 4.

Figure 4B:
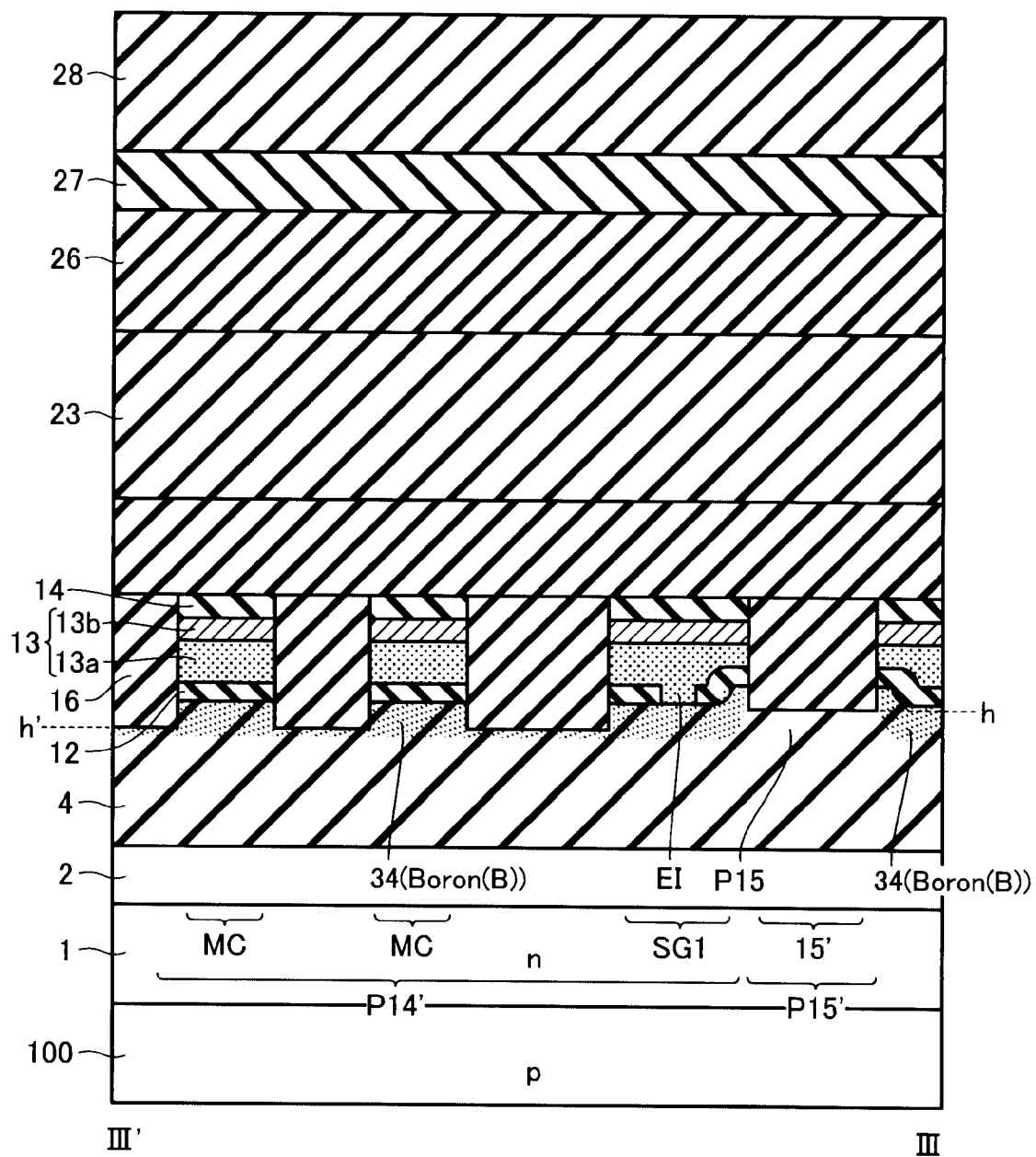
FIG. 4B is a cross-sectional view taken along line III-III' of FIG. 1.

In addition, as illustrated in FIG. 4B, the device isolation/insulation film 4 may be over-etched while control gates 13 are processed. In this case, the top surface of the device isolation/insulation film 4 between the control gates 13 would be lower than the bottom surface of the intergate insulation film 12. Wherein, the position h represents the highest position of the top surface of the device isolation/insulation film 4 within the area P15', and the position h' represents the lowest position of the top surface of the device isolation/insulation film 4 between the control gates 13. Again, the device isolation/insulation film 4 has a surface position h within the area P15' (the second area) that is higher than a surface position h' in the other area P14' (the first area). Meanwhile, the position h' may be lower or higher than the bottom surface of the diffusion region 32. The position h' may also be lower than the top surface of the p-type well 2. Likewise, the position h may be lower or higher than the bottom surface of the diffusion region 32. Alternatively, the position h may be lower than that top surface of the p-type well 2.

Figure 5:
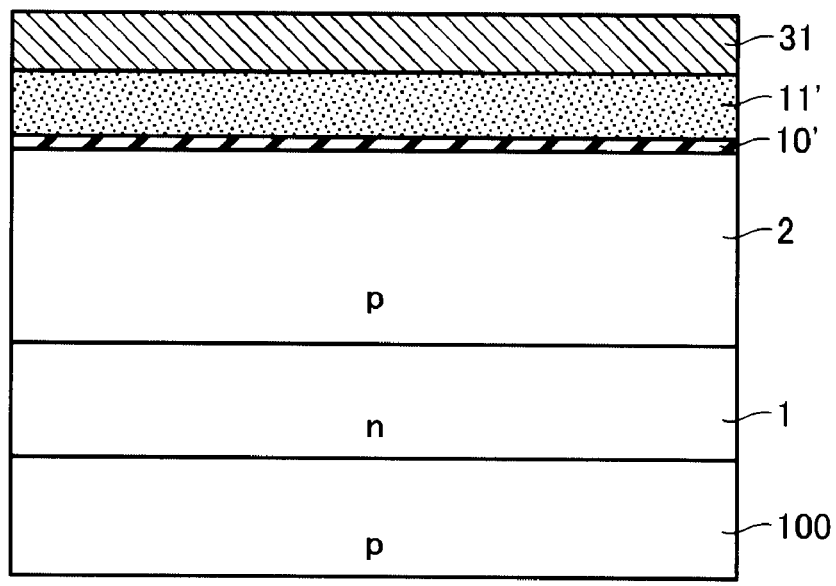
FIG. 5 illustrates a manufacturing process of a semiconductor storage device according to the first embodiment.
Figure 6:
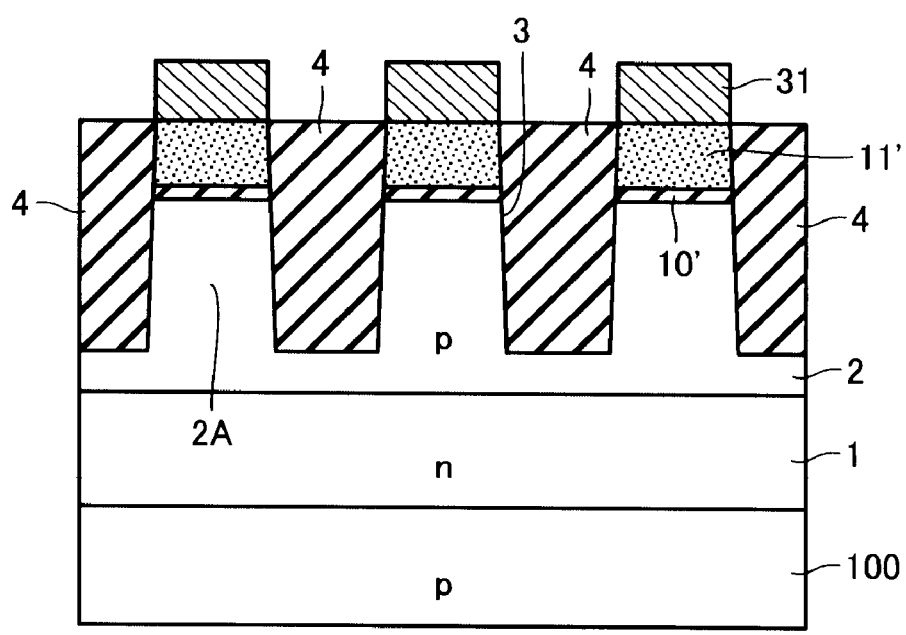
FIG. 6 illustrates the manufacturing process of the semiconductor storage device of the first embodiment.
Figure 7:
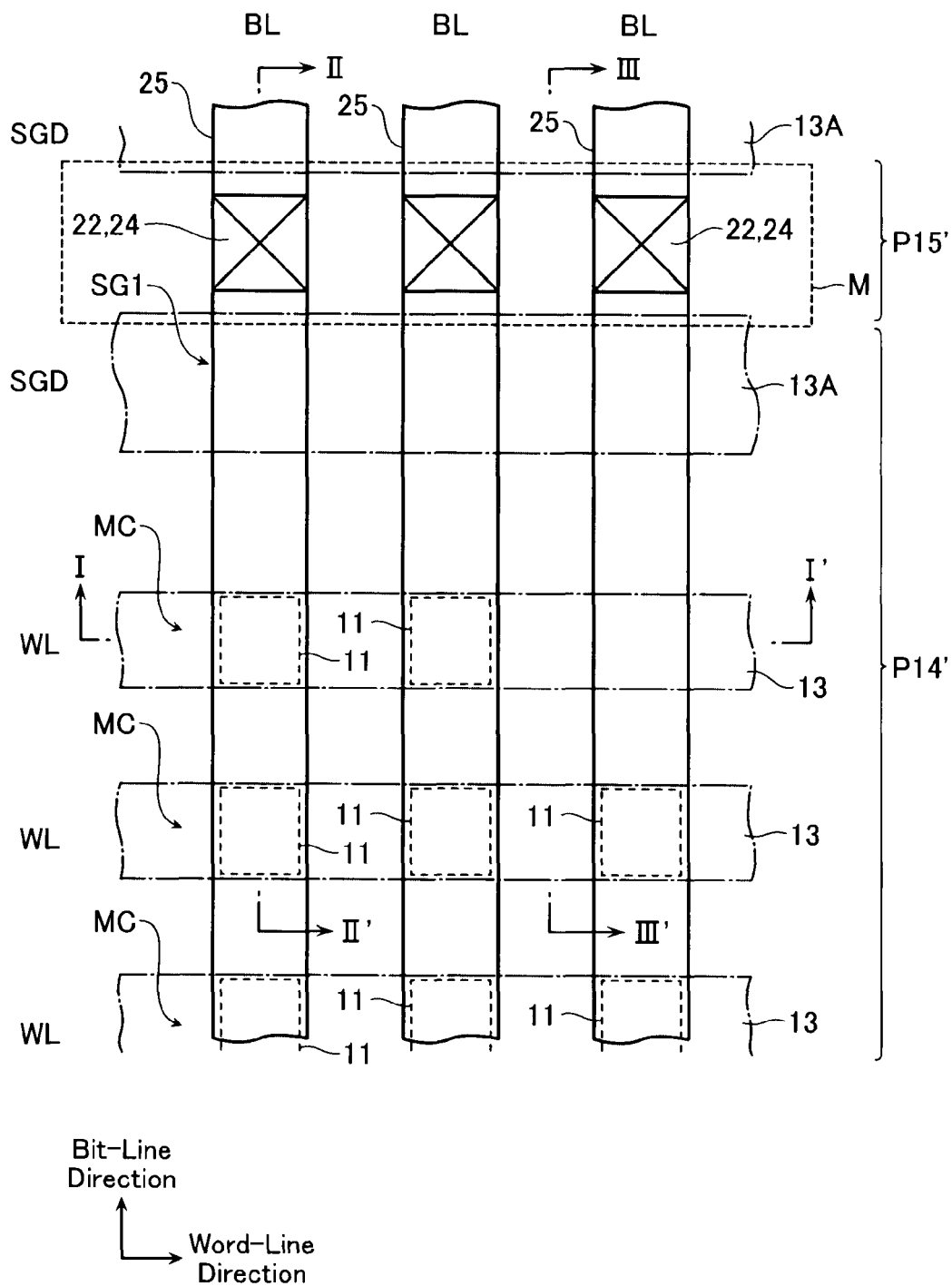
FIG. 7 illustrates the manufacturing process of the semiconductor storage device of the first embodiment.

Referring now to FIGS. 5 to 10B, a manufacturing process of a semiconductor storage device of the first embodiment will be described below. FIGS. 5, 6, 8A, 9A, 10A, and 10B illustrate the shapes of the section I-I' of FIG. 1 in respective steps of this manufacturing process. FIG. 7 illustrates a position at which a mask M is formed when boron implantation is performed. FIGS. 8B and 9B illustrate the shapes of the section of FIG. 1 in respective steps of this manufacturing process.

As illustrated in FIG. 5, an n-type well 1 is formed at a region where memory cells MC are formed on the p-type silicon substrate 100, and a p-type well 2 is further formed thereon. Furthermore, an oxide film 10' that provides a tunnel oxide film 10 is formed on the p-type well 2 through thermal oxidation. A conductive film 11' (polysilicon film) that provides a floating gate 11 and an insulation film 31 are sequentially deposited thereon. At this stage, ion implantation is not performed to form an impurity at a channel part.

As illustrated in FIG. 6, a resist is formed on the insulation film 31, and is patterned to fit the shape of the device isolation/insulation films 4 using a photolithography technology. Then, Reactive Ion Etching (RIE) is performed using the patterned resist as a mask to etch the insulation film 31, the conductive film 11', the oxide film 10', and the p-type silicon substrate 100. As a result, a plurality of trenches 3 are formed from the surface of the insulation film 31 to reach the p-type well 2 in the p-type silicon substrate 100. Meanwhile, this step of forming trenches 3 may utilize a so-called a sidewall processing process. Those regions of the p-type well 2 that are sandwiched between the plurality of trenches 3 provide device formation regions 2A as mentioned above. The device formation regions 2A are formed along a vertical direction to the drawing sheets of FIGS. 5, 6, 8A, 9A, 10A, and 10B as its longitudinal direction (in other words, along the longitudinal direction of the bit lines BL).

The resist is removed by an ashing process in an oxidizing atmosphere, and then, for example, a TEOS film is deposited on the entire surface of the silicon substrate 100 so as to bury the trenches 3. An etch-back process is performed using the insulation films 31 as masks to form device isolation/insulation films 4 only within the trenches 3. At this point, the top surfaces of the device isolation/insulation films 4 are formed at substantially the same level as the top surfaces of the conductive films 11'.

Figure 8A:
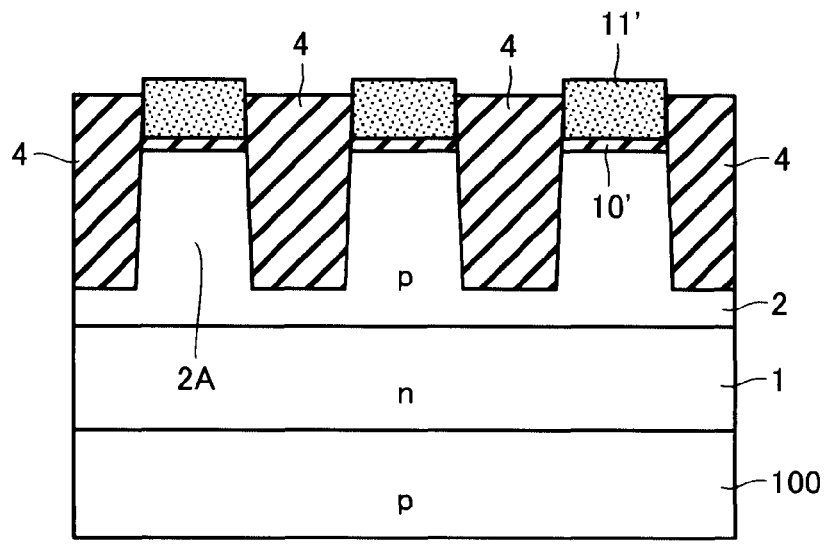
FIG. 8A illustrates the manufacturing process of the semiconductor storage device of the first embodiment.
Figure 8B:
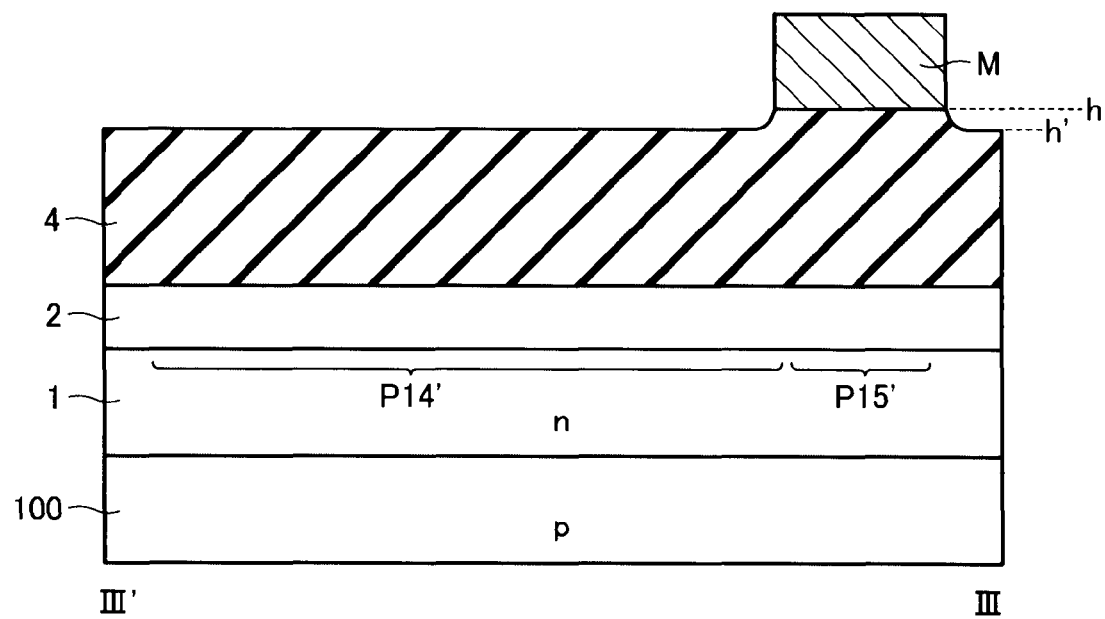
FIG. 8B illustrates the manufacturing process of the semiconductor storage device of the first embodiment.

After the insulation films 31 are removed, the vicinity of a drain contact diffusion region 15' (i.e., an area P15' sandwiched between two select gate lines SGD) is covered with a resist M, as illustrated in FIG. 7. In FIG. 7, for ease of understanding where the resist M is formed, word lines 13 and select gate lines 13A are indicated by the dashed-dotted line, while contacts 22 and 24 are indicated by the solid line. Actually, these wirings do not exist at this stage of forming the resist M. Although not illustrated, a peripheral circuit formation region where peripheral circuits are formed is also covered with the resist M. As illustrated in FIGS. 8A and 8B, the device isolation/insulation films 4 are further etched back with photolithography, RIE, and so on, so that the top surfaces are located below the top surfaces of the conductive films 11'. As a result, the position h of the top surfaces of the device isolation/Insulation films 4 within the area P15' becomes higher than the position h' of the top surfaces of the device isolation/insulation films 4 within the area P14'.

Figure 9A:
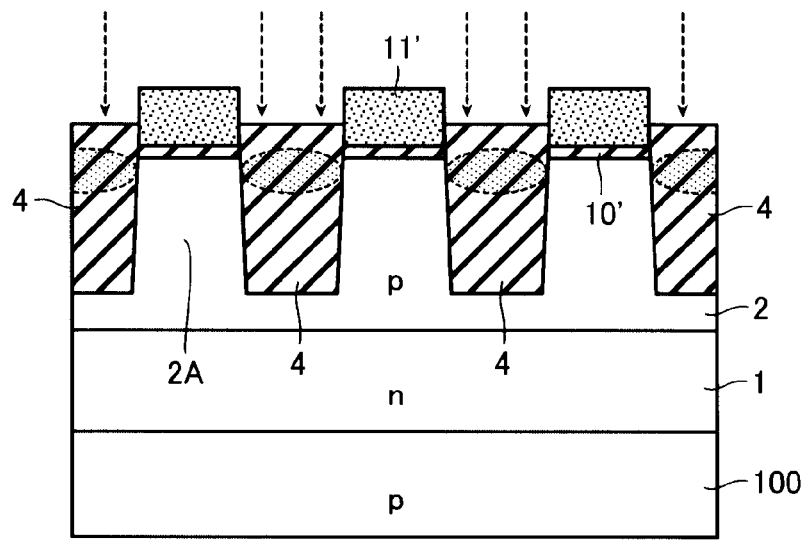
FIG. 9A illustrates the manufacturing process of the semiconductor storage device of the first embodiment.
Figure 9B:
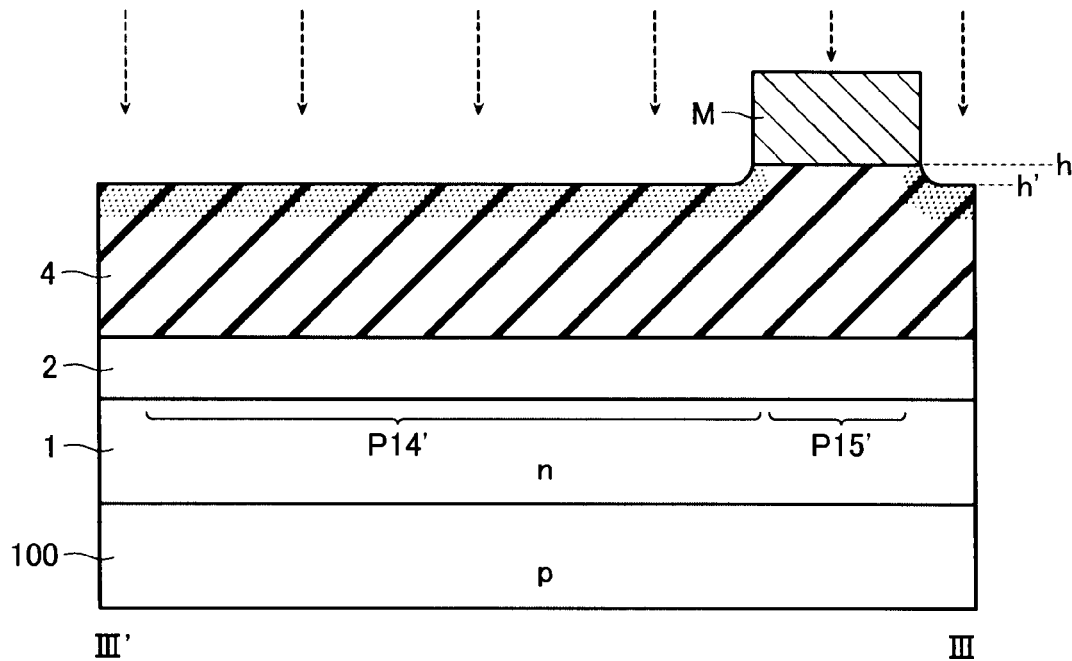
FIG. 9B illustrates the manufacturing process of the semiconductor storage device of the first embodiment.

As illustrated in FIGS. 9A and 9B, p-type impurities such as boron (B) are implanted into the device isolation/insulation films 4 so that the amount of dose is $10^{11}$ to $10^{13}$ cm$^{-2}$ and the implantation depth is on the order of 0.1 µm or less. This implantation is referred to herein as "side-surface diffusion implantation". At this point, the conductive layers 11' function as masks. As used herein, the term "mask" means that less impurities are implanted into the device formation regions 2A than into the device isolation/insulation films 4, rather than that the conductive layers 11' completely prevents the impurities from passing through. In addition, as illustrated in FIG. 9B, boron (B) is not implanted into the device isolation/insulation films 4 within the area P15' due to the existence of the resist M as a mask, while being implanted into the device isolation/insulation films 4 within the area P14'. Note that the boron (B) implanted into the device isolation/insulation films 4 within the area P14' may be diffused toward the device isolation/insulation films 4 within the area P15'. However, the amount of such diffusion is so limited that its effects are negligible. Therefore, boron (B) is not diffused into the region where an n-type drain contact diffusion region 15' is to be formed, and the junction leakage would be small.

The device isolation/insulation films 4 extend in the vertical direction to the drawing sheets of FIGS. 6, 8A, 9A, 10A, and 10B, and impurities are uniformly implanted across these regions.

In this case, it is desirable that impurities are implanted at an angle such that the diffusion effectively occurs from the device isolation/insulation films 4 to the device formation regions 2A, which will be later described. At this moment, the device isolation/insulation films 4 have stripe-patterned openings in their upper ends, and a difference in level between the top surfaces of the conductive films 11' and the top surfaces of the device isolation/insulation films 4 is as small as 10 nm to 30 nm. This may offer a higher degree of freedom to set an angle for impurity implantation as compared with the conventional art where impurities are implanted from spaces between word lines toward the channel parts (the distance between the top surfaces of the word lines and the top surface of the p-type silicon substrate 100 is on the order of about 100 nm). Note that although these impurities are also implanted into the conductive films 11', the conductive films 11' may be little affected by the implanted impurities as the original impurity concentration of the conductive films 11' is almost two orders of magnitude or more greater than that associated with the impurity implantation.

In addition, performing side-surface diffusion implantation, with the top surfaces of the device isolation/insulation films 4 located lower than the top surfaces of the conductive layers 11', allows impurities to be implanted into those positions within the device isolation/insulation films 4 deeper than the top surfaces of the device formation regions 2A, while improving features of the conductive layers 11' as masks.

Figure 10A:
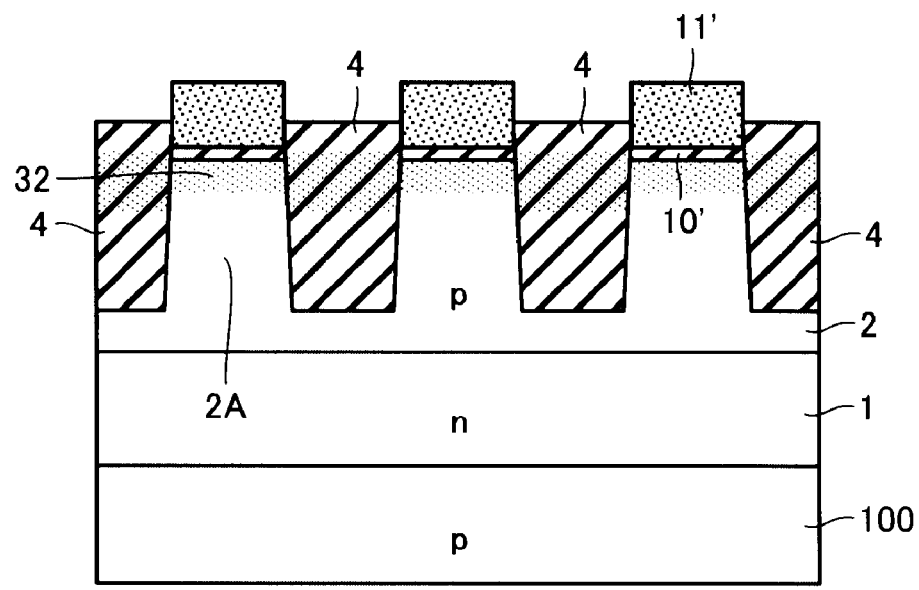
FIG. 10A illustrates the manufacturing process of the semiconductor storage device of the first embodiment.

After the resist M is removed, as illustrated in FIG. 10A, a thermal process is performed at 500 to 1100 degrees Celsius. This causes boron that has been implanted into the device isolation/insulation films 4 to be diffused to the p-type well 2 in the device formation regions 2A, thereby forming diffusion regions 32. At this point, boron is diffused in a substantially uniform manner from the device isolation/insulation films 4 in contact with each side surface in the word-line direction of respective device formation regions 2A. As a result, the p-type impurities are diffused from the device isolation/insulation films 4 formed on the right and left sides of respective device formation regions 2A, toward respective positions near the middle of the device formation regions 2A. Eventually, the p-type impurities diffused from the right and left sides are connected to each other at respective positions near the middle of the device formation regions 2A. In addition, since the device formation regions 2A and the device isolation/insulation films 4 extend in the bit-line direction, the diffusion regions 32 are formed to cover the whole area of the device regions 2A where the memory cells MC and the select gate transistors SG1, SG2 included in the NAND cell unit are formed. As mentioned earlier, due to the existence of the mask M, a diffusion region 32 is not formed within the area P15' where a drain contact diffusion region 15' is to be formed. Nevertheless, there might be a situation where boron is slightly diffused from the area P14' into the area P15'. In that case, however, the impurity concentration of boron in the device regions 2A within the area P15' is very small as compared with that involved in the diffusion regions 32 in the device regions 2A within the area P14'.

Figure 10B:
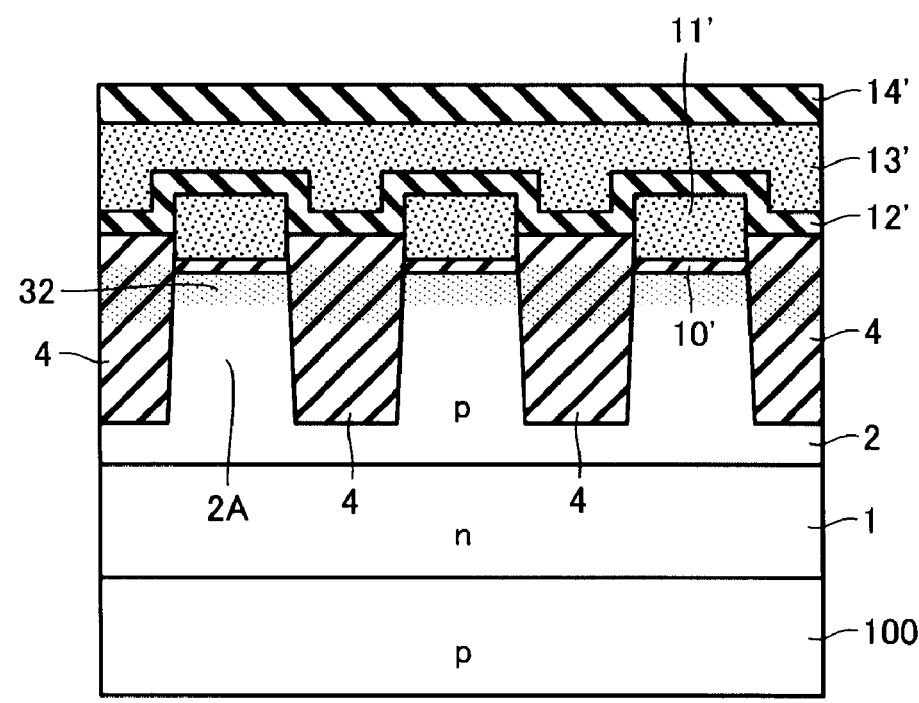
FIG. 10B illustrates the manufacturing process of the semiconductor storage device of the first embodiment.

As illustrated in FIG. 10B, an ONO film 12' corresponding to an intergate insulation film 12 is formed on the top surfaces of the conductive layers 11'. Moreover, a lamination film 13', including a polysilicon film and a tungsten silicide (WSi) film corresponding to the control gate 13, is formed thereon. Then, the conductive layers 11', the ONO film 12', and the lamination film 13' are processed to the shapes of word lines WL and select gate lines SGD (gate electrode processing). During this gate electrode processing, such device isolation/insulation films 4 that are located in a region outside the pattern of word lines WL and select gate lines SGD may be etched at the same time and their top surfaces may be lowered correspondingly. As a result, as illustrated in FIG. 4B, the top surfaces of the device isolation/insulation films 4 located between word lines WL, between a word line WL and a select gate line SGD, and between select gate lines SGD may become lower than the bottom surfaces of the intergate insulation films 12. Ion implantation is performed using the word lines WL and the select gate lines SGD as masks to form diffusion layers 15 and 15' between memory cells MC, between a memory cell MC and a select gate transistor SG1, and between select gate transistors SG1, respectively. Thereafter, the NAND-type flash memory is completed as illustrated in FIGS. 1 to 4 by a well-known method of manufacturing NAND-type flash memory.

Note that in the above-mentioned manufacturing method, the etching step (FIG. 8A) is performed for lowering the level of the top surfaces of the device isolation/insulation films 4 below the level of the top surfaces of the conductive films 11' prior to the implantation of p-type impurities as described above (FIG. 9A). However, the implantation of p-type impurities may be performed prior to the step of FIG. 8A. In that case, since the conductive layers 11' as well as the insulation films 31 may be used as masks, it is possible to suppress variations in the property of memory cell transistors due to the implantation of impurities into the conductive layers 11'. Furthermore, it is also possible to increase the impurity concentration of impurities to be implanted because of the reduction in the amount of impurities implanted into the conductive layers 11'. This may result in a higher impurity concentration in the channel diffusion layers 32.

Additionally, although the p-type impurities implanted into the device isolation/insulation films 4 are diffused through a thermal process in FIG. 10A, for example, the p-type impurities may be diffused by the heat generated during other film formation steps and so on, instead of performing this thermal process specialized for diffusion of p-type impurities. For example, such diffusion may be caused by thermal processes, such as being performed in forming an ONO film 12' corresponding to an intergate insulation film 12, or in forming other diffusion layers, e.g., source/drain diffusion layers. Consequently, some of the manufacturing steps may be omitted.

According to this embodiment, boron is implanted into the device isolation/insulation films 4, and then diffused toward the device formation regions 2A through thermal diffusion, thereby forming diffusion regions 32 on the surfaces of the channel parts. It should be noted here that in the conventional art, boron is implanted into the channel parts by means of angled ion implantation from spaces between word lines WL after the gate electrodes of the memory cells are formed. However, this method is subject to the variations in concentration of implanted impurities. This principle will be described in detail below.

Figure 11A:
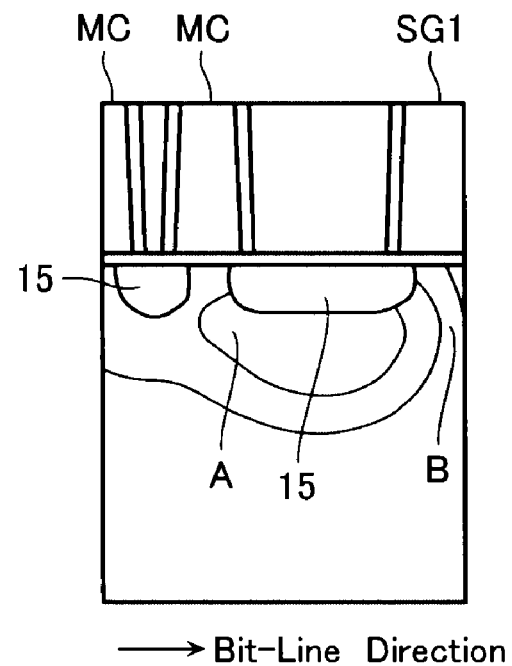
FIG. 11A illustrates a result of simulating the distribution of impurity concentration when performing channel implantation into the channel part of a memory cell, by means of ion implantation from spaces between word lines WL and between a word line WL and a select gate line SGD, as is done in the conventional art.
Figure 11B:
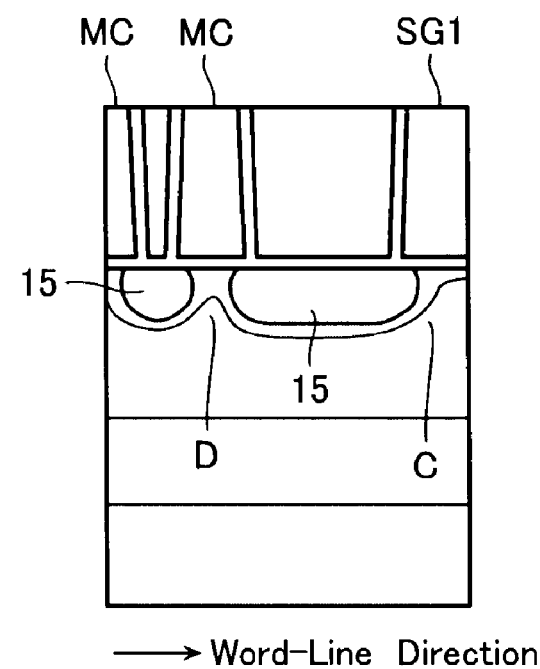
FIG. 11B illustrates the distribution of impurity concentration when performing channel implantation into the channel part of a memory cell MC, by means of side-surface diffusion implantation (FIGS. 9 to 10A) according to this embodiment.

FIGS. 11A and 11B are cross-sectional views illustrating memory cells MC and a select gate transistor SG1 adjacent to a memory cell MC in a section taken along line II-II' of FIG. 1. FIG. 11A illustrates a result of simulating the distribution of impurity concentration when performing channel implantation into the channel part of a memory cell, by means of ion implantation from spaces between word lines WL and between a word line WL and a select gate line SGD, as an comparative example. Note that a thick line in the figure represents a boundary (pn-junction boundary) between n-type impurities and p-type impurities, and a thin line represents a region in which the same concentration of p-type impurities is provided.

In this case, as can be seen from points A and B in FIG. 11A corresponding to the channel parts of the memory cell MC adjacent to the select gate transistor SG1 and other memory cells MC, the concentration of p-type impurities below the channel parts is not constant in the bit-line direction. In addition, if any variations in manufacture result in different spaces between memory cells MC, then the channel parts may have different impurity concentrations for different memory cells MC. This could cause variations in the property of memory cells MC, leading to degradation in reliability. This tendency becomes even more pronounced as miniaturization advances.

On the other hand, FIG. 11B illustrates the distribution of impurity concentration when performing channel implantation on the channel parts of memory cells MC by means of the side-surface diffusion implantation according to this embodiment (see FIGS. 9A and 9B). In this case, as one can see little difference in impurity concentration between the channel part of the memory cell MC adjacent to the select gate transistor SG1 and the channel parts of the other memory cells MC, there is a substantially uniform distribution of impurity concentration in the bit-line direction (as indicated by positions C and D in FIG. 11B, the impurity concentration curves extend in parallel, and at regular intervals, along the bit-line direction at any positions in the channel parts of the multiple memory cells MC). Thus, according to this embodiment, there cannot be any variation in the property of the memory cells MC, improving the reliability of the memory device.

In addition, when impurities are implanted into the channel parts before formation of the device isolation/insulation films 4, the impurities that are once implanted into the channel regions of the memory cells MC would flow out into the device isolation/insulation films 4 due to the segregation through a thermal process and so on. This causes dilution of the impurity concentration at the sidewalls of the device formation regions in the word-line direction. Consequently, the distribution of impurity concentration changes at the channel parts (i.e., the channel profile is disturbed), which leads to degradation in the cut-off characteristics of memory cells MC and select gate transistors.

However, p-type impurities are implanted into the device isolation/insulation films 4 and introduced to the channel regions (device formation regions 2A) of memory cells MC by means of diffusion from the device isolation/insulation films 4 in this embodiment. This is because the device isolation/insulation films 4 always involve an impurity concentration higher than that of the device formation regions 2A (including the channel parts of the memory cells MC) according to the diffusion principles. As such, there is a significantly reduced possibility as compared with the conventional art that the p-type impurities in the device formation regions 2A can be drawn out of any device formation regions 2A during the subsequent steps of forming device isolation/insulation films, or due to the segregation through a thermal process, even if the impurity concentration of the channel parts is increased.

In addition, according to this embodiment, as illustrated in FIG. 3, diffusion regions 32 corresponding to p-type impurity diffusion regions are not formed in device formation regions 2A that are located at drain contact diffusion regions 15' (n-type impurity diffusion regions). That is, it can be considered that the diffusion regions 32 and the drain contact diffusion regions 15' are formed separately from each other. If any diffusion region 32 is also formed at a position where a drain contact diffusion region 15' is formed, then the change curve of impurity concentration near the boundary of a pn junction in the drain contact diffusion region 15' becomes steep. This would lead to an increase in junction leakage. According to this embodiment, as described above, any diffusion region 32 corresponding to a p-type impurity diffusion region is not formed at a position where a drain contact diffusion region 15' (n-type impurity diffusion region) is formed. As a result, the change curve of impurity concentration at a pn junction becomes gentle. This may result in a reduction in junction leakage.

In addition, applying a mask M to prevent device isolation/insulation films 4 from being etched back within the area P15' where drain contact diffusion regions 15' are formed also provides the following advantages. That is, if the device isolation/insulation films 4 are etched back within the area P15', then etching residues tend to remain on the sidewalls of floating gates 11 that are exposed from the device isolation/insulation films 4 between select gate lines SGD during the gate electrode processing. Such etching residues could disturb ion implantation to form source/drain diffusion layers of select gate transistors SG1. Thus, any variations in the magnitude of the etching residues among select gate transistors also lead to variations in the amount of ion implantation as well as in the property of the select gate transistors. This embodiment avoids device isolation/insulation films 4 from being etched back near the drain contact diffusion regions 15', and is less likely to involve etching residues as mentioned above. This may avoid variations in the property of the select gate transistors SG1.

In addition, applying a mask M to prevent device isolation/insulation films 4 from being etched back within the area P15' where drain contact diffusion regions 15' are formed also provides other advantages as described below. An impurity concentration (in this embodiment, concentration of n-type impurities) of each drain contact diffusion region 15' is set to be higher than that of the other diffusion regions in order to reduce the contact resistance. At this point, if the device isolation/insulation films 4 are etched back within the area P15' of the drain contact diffusion regions 15' and the upper portions of the device formation regions 2A are exposed from the device isolation/insulation films 4, then the drain contact diffusion regions 15' are expanded due to thermal diffusion. This may lead to some deficiencies such as crystal defects.

However, according to this embodiment, the device isolation/insulation films 4 are not etched back within the area P15', and the top surfaces of the device isolation/insulation films 4 are located at the same level as the top surfaces of the floating gates 11 (in the case of FIG. 4A). Thus, the device isolation/insulation film 4 may function as liner films that prevent the device formation regions 2A from being expanded in the drain contact diffusion regions 15 due to thermal diffusion, thereby suppressing any crystal defects.

[Second Embodiment]

Figure 12:
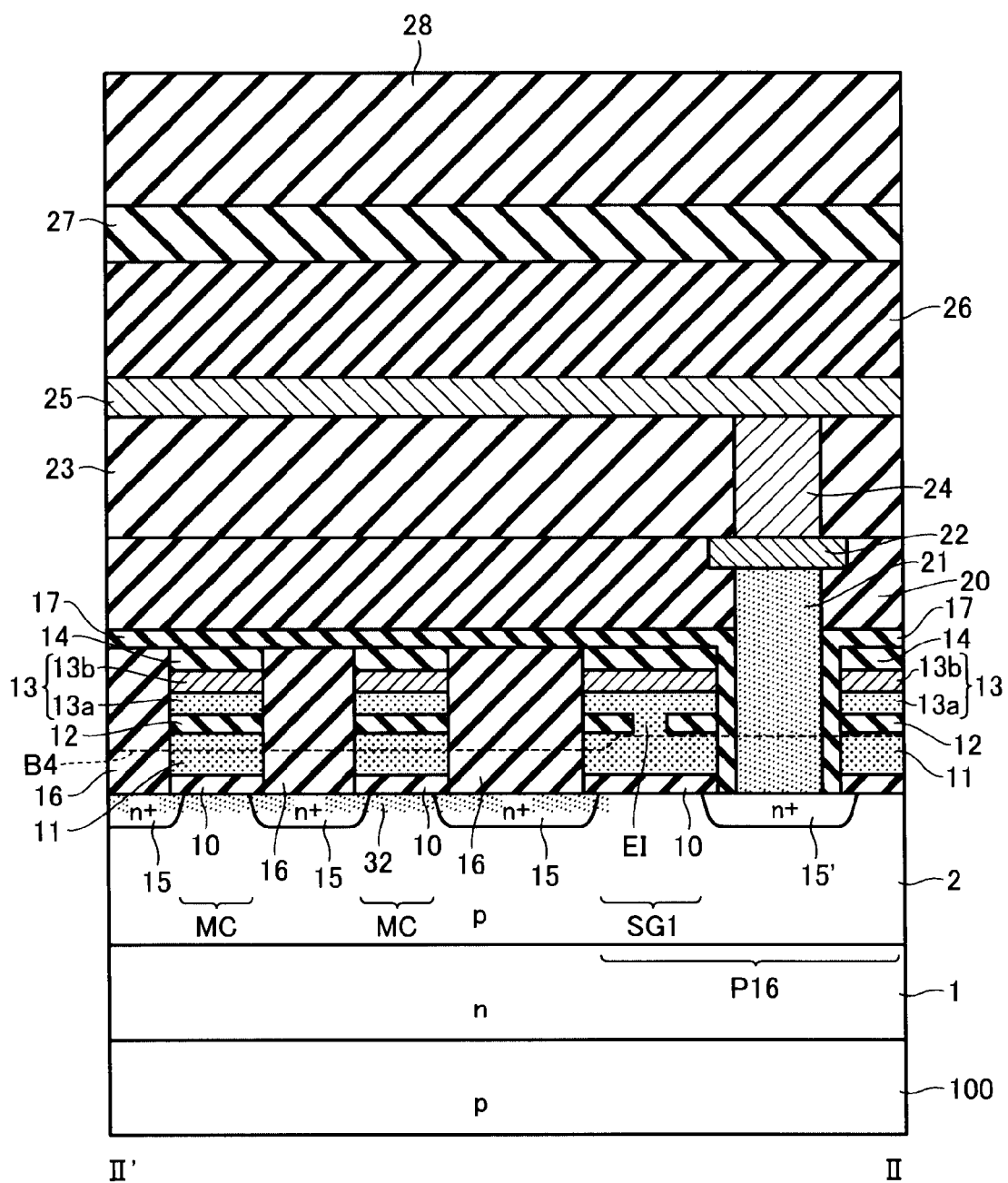
FIG. 12 is a cross-sectional view taken along line II-II' of FIG. 1 for the NAND-type flash memory according to a second embodiment of the present invention.
Figure 13:
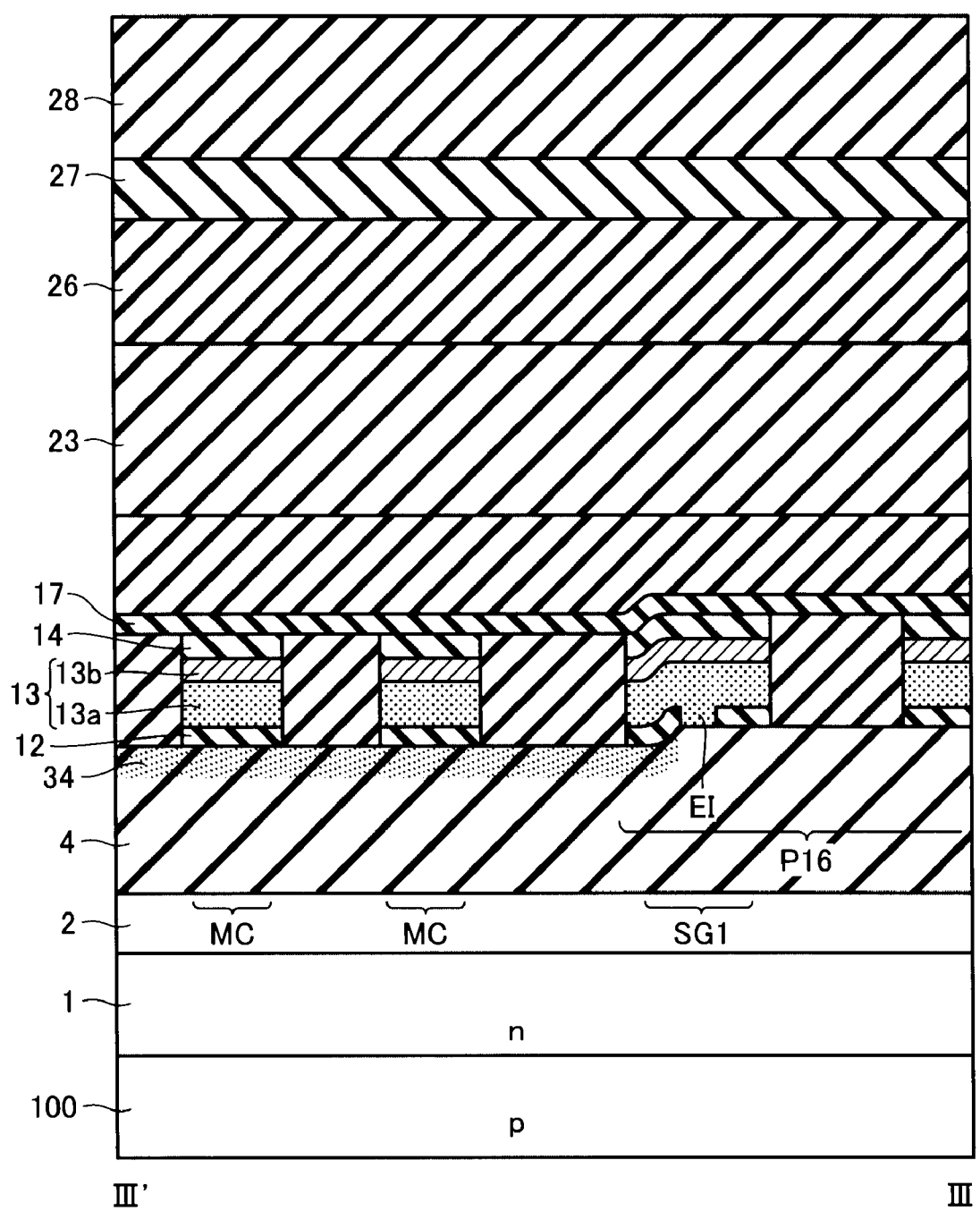
FIG. 13 is a cross-sectional view taken along line III-III' of FIG. 1 for the NAND-type flash memory of the second embodiment of the present invention.
Figure 14:
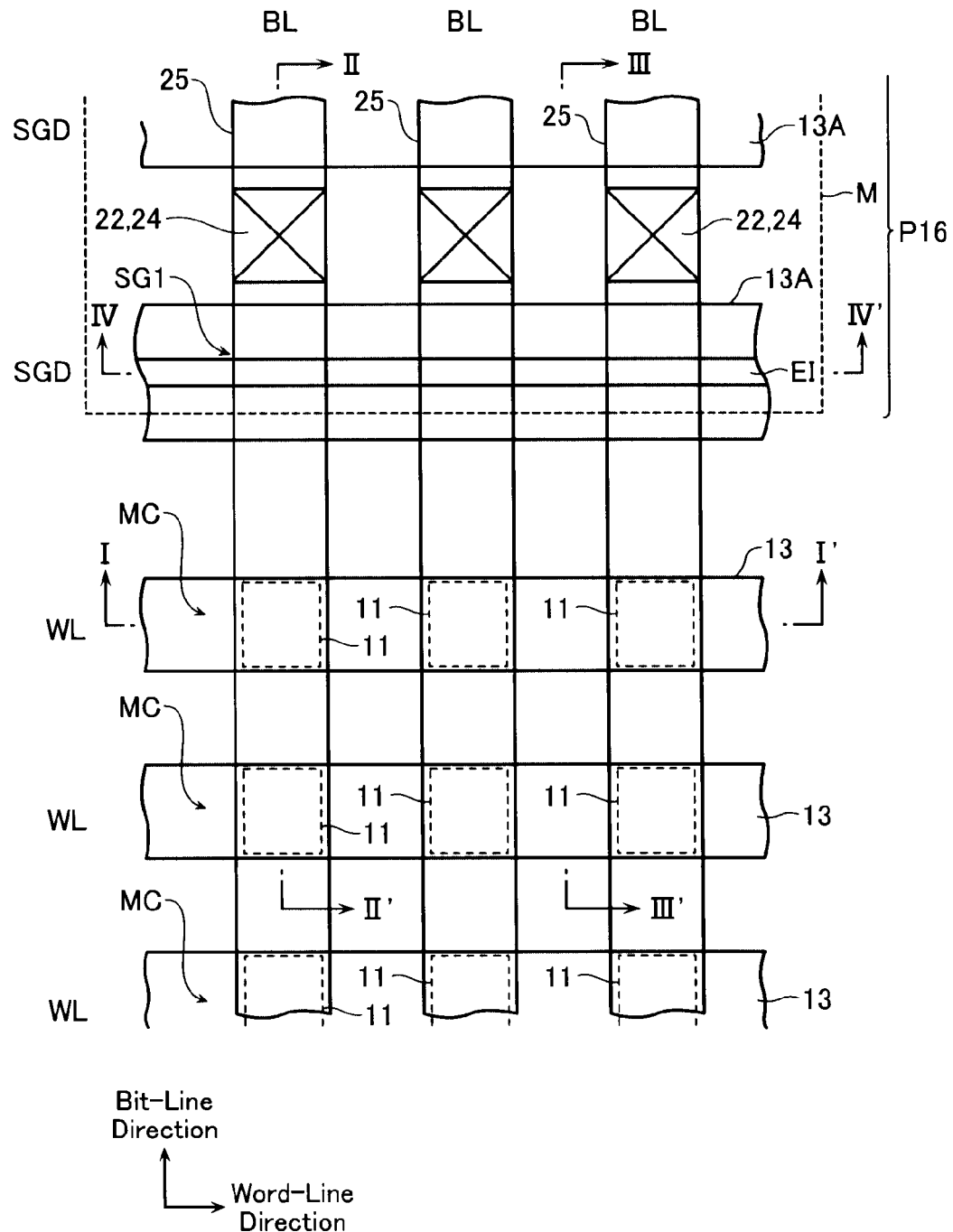
FIG. 14 illustrates a manufacturing process of the semiconductor storage device of the second embodiment.

Referring now to FIGS. 12 to 14, a second embodiment of the present invention will be described below. The configuration of the memory cell array part of this embodiment is the same as that of the first embodiment (FIGS. 1 and 2) regarding the structures of the plane layout and the section I-I'. However, the structures of sections II-II' and III-III' are different from the first embodiment.

Specifically, as can be seen from the section II-II' illustrated in FIG. 12, the diffusion region 32 is neither formed near the drain contact diffusion region 15', nor in the most area immediately below the drain-side select gate transistor SG1. As such, the first embodiment is different from the second embodiment in that the diffusion region 32 is also formed in the channel part of the drain-side select gate transistor SG1.

The diffusion region 32 is formed immediately below the select gate transistor SG1, but it is only formed in a very small area closer to the memory cells MC than the aperture EI. Additionally, as indicated by the broken line B4 of FIG. 12, and as can be seen from FIG. 13, the top surface of the device isolation/insulation film 4 within an area P16 where the drain contact diffusion region 15' and the select gate transistor SG1 are formed (the device isolation/insulation film 4 formed immediately below the aperture EI is also included in the area P16) is made higher than that within the other area (where memory cells MC are formed). In other words, the device isolation/insulation film 4 is not etched back within the area P16, while being etched back in the other area (including memory cells MC and source-side select gate transistors SG2).

This configuration may be obtained by, as illustrated in FIG. 14, forming a mask M to cover the most parts of drain contact diffusion regions 15' and a select gate line SGD (except the parts on the side close to a memory cell MC). Other manufacturing steps may be substantially the same as those described in FIGS. 5 to 10B.

This embodiment has the same advantages as the first embodiment. In addition to this, it provides the following advantages. That is, according to this embodiment, the most part of a select gate line SGD is covered with a mask M, and a part where an aperture EI is formed is also covered with the mask M. Accordingly, the device isolation/insulation films 4 are not etched back at the position where the aperture EI is formed. Thus, the respective positions in the height direction of the intergate insulation films 12 and the aperture EI remain constant in the word-line direction (the vertical direction to the drawing sheet of FIG. 13) (see FIG. 15).

Figure 15:
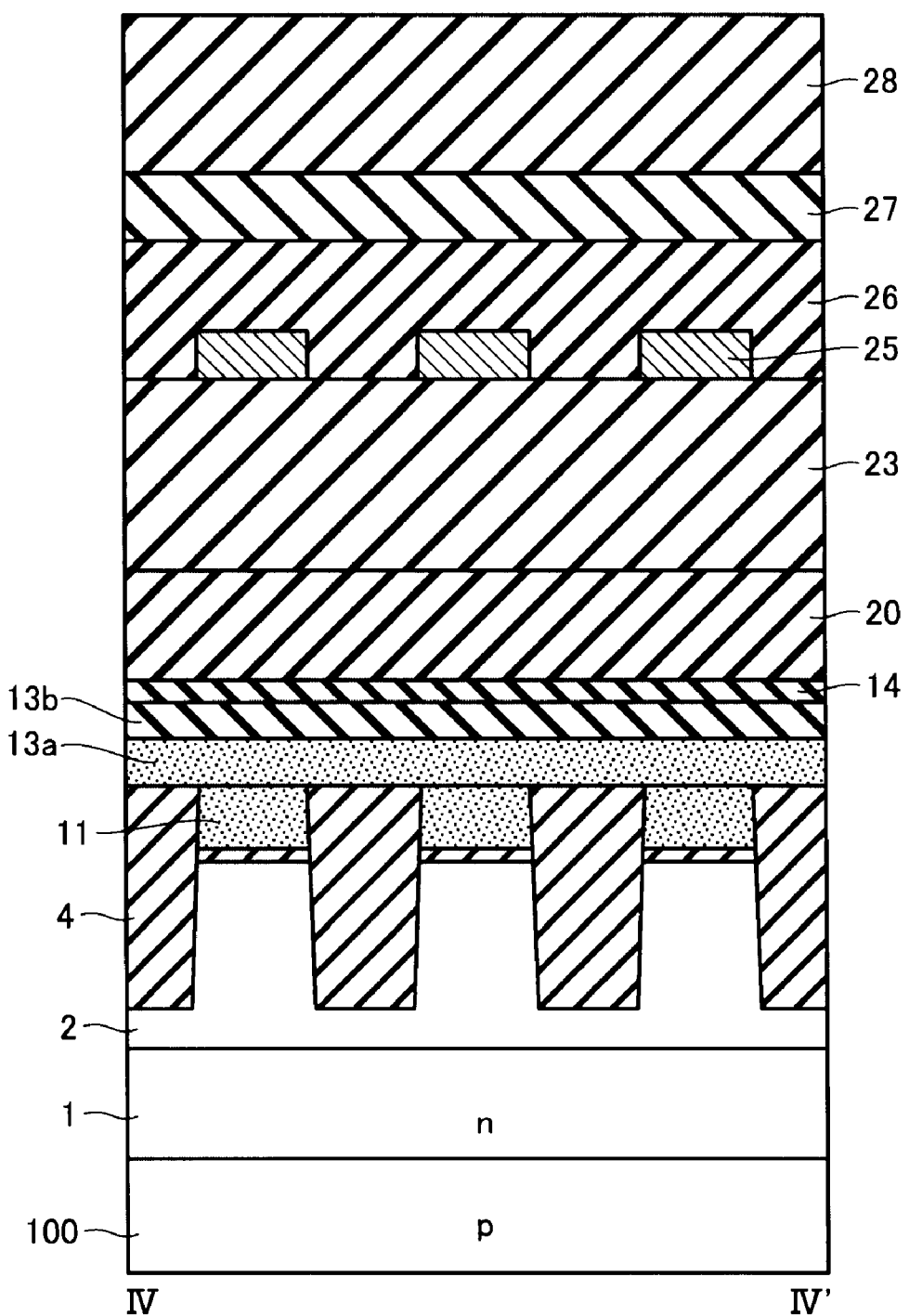
FIG. 15 is a cross-sectional view taken along line IV-IV' of FIG. 1 for the NAND-type flash memory of the second embodiment of the present invention.

If the device isolation/insulation films 4 are etched back at the position of the aperture EI, then the intergate insulation films 12 assume a shape having recesses at the positions of the device isolation/insulation films 4 in section IV-IV' of FIG. 15. Accordingly, the aperture EI is not at a constant position in the height direction and thus involves some undulation in the horizontal direction. Such an aperture EI is difficult to be formed to a desired width, which could reduce the yield. In this regard, It is possible for the aperture EI to be formed to the desired width since the aperture EI has the same height (lies flat) in the section IV-IV'.

[Third Embodiment]

Figure 16:
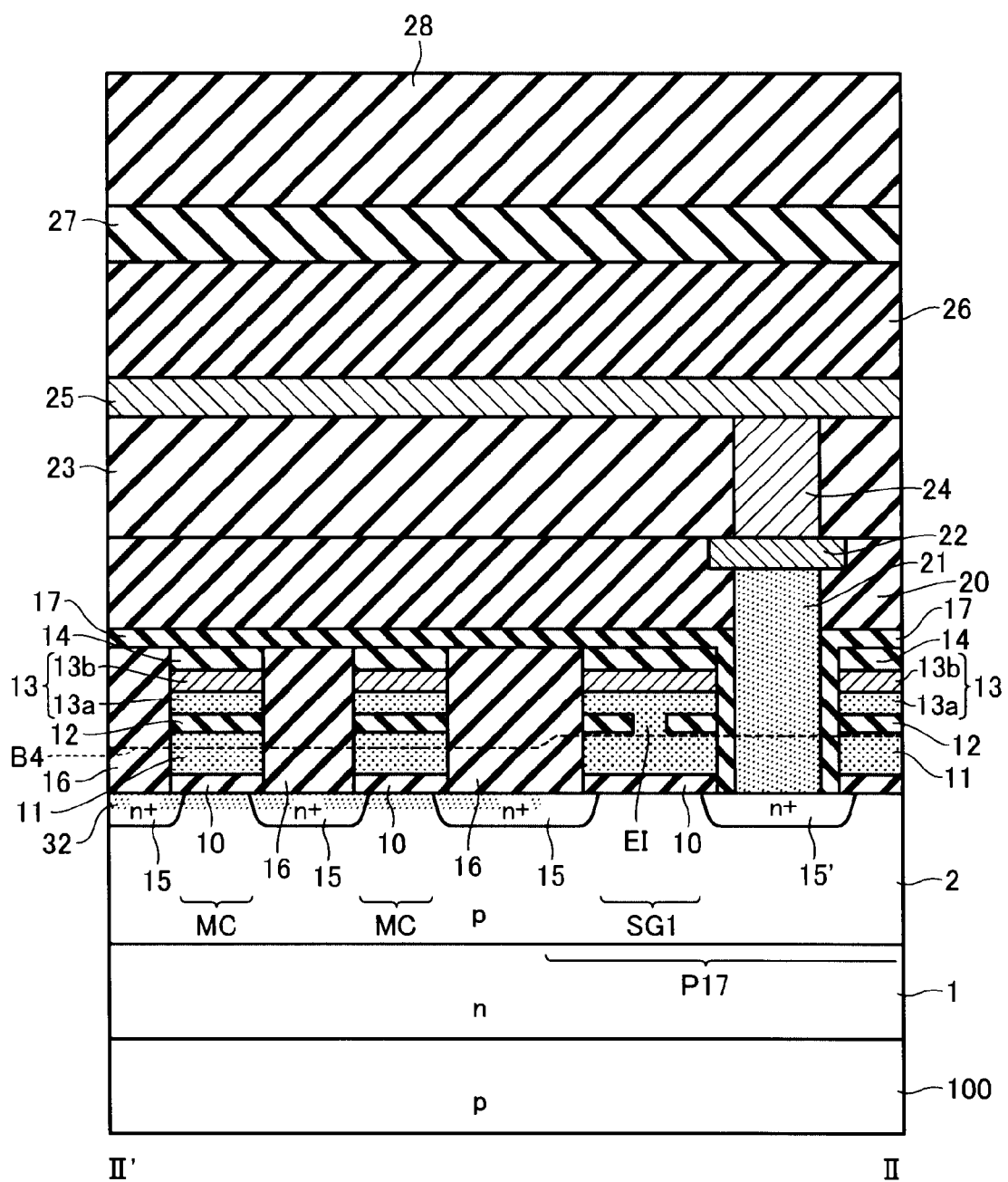
FIG. 16 is a cross-sectional view taken along line II-II' of FIG. 1 for the NAND-type flash memory according to a third embodiment of the present invention.
Figure 17:
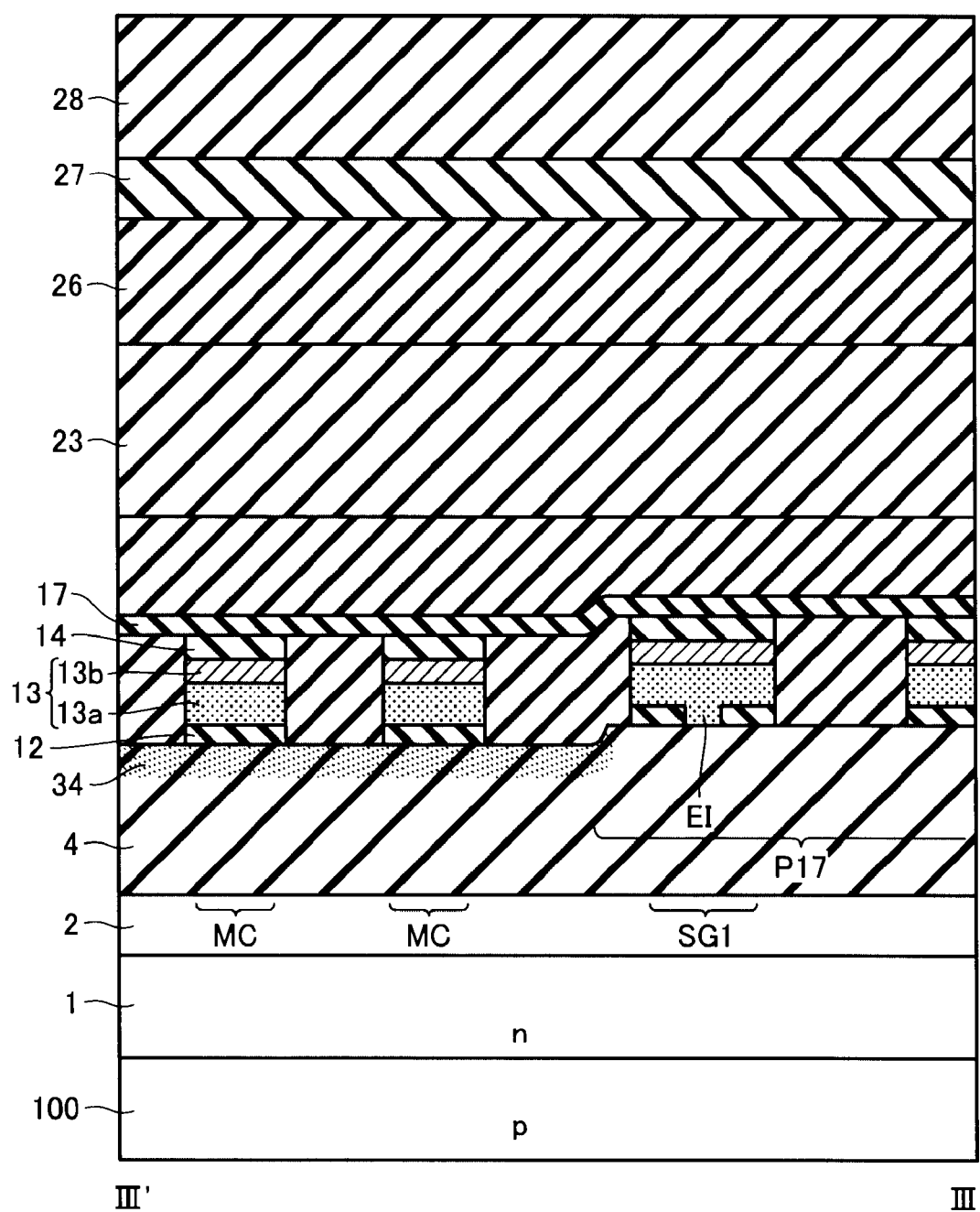
FIG. 17 is a cross-sectional view taken along line III-III' of FIG. 1 for the NAND-type flash memory of the third embodiment of the present invention.
Figure 18:
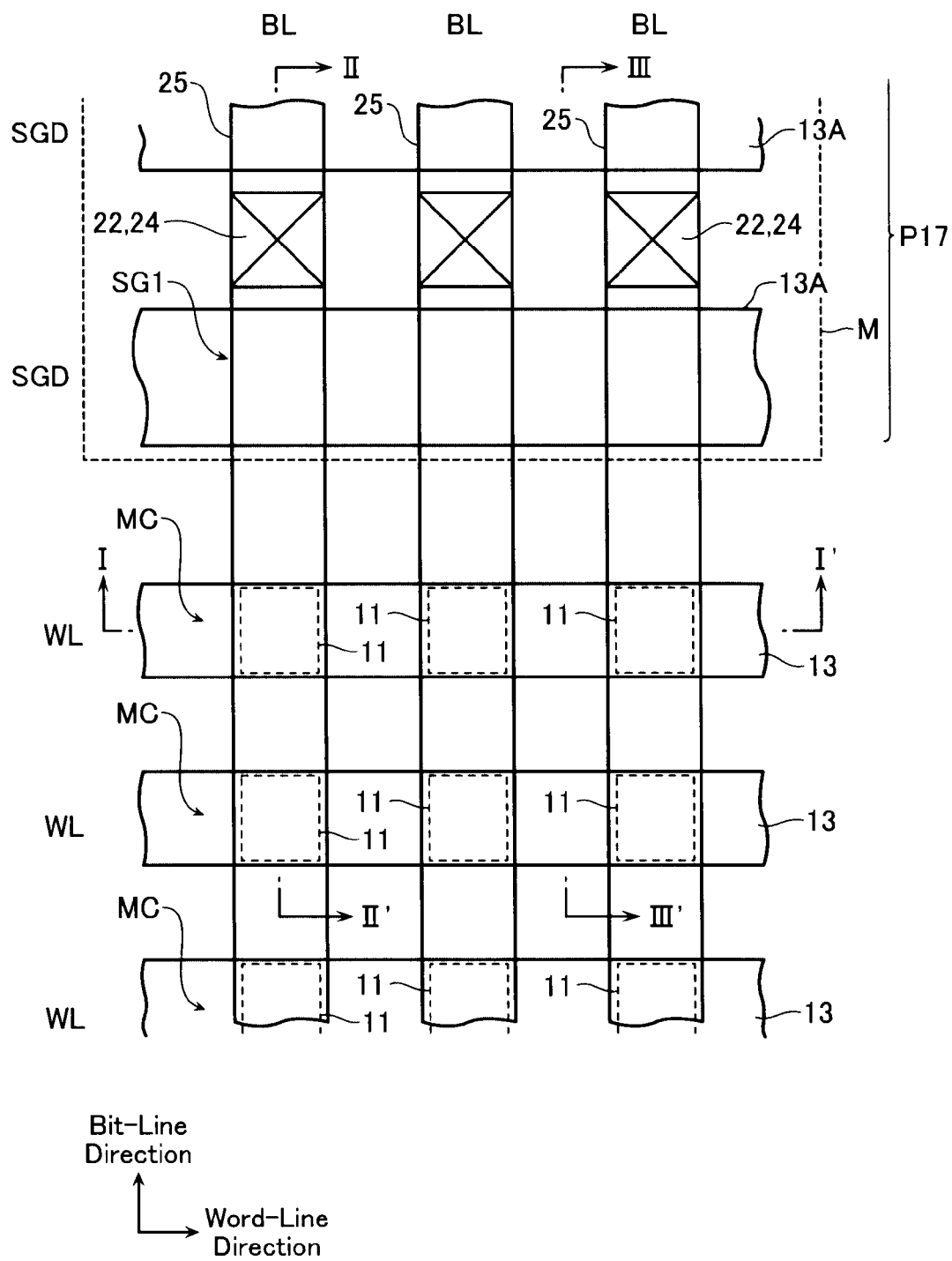
FIG. 18 illustrates a manufacturing process of the semiconductor storage device of the third embodiment.
Figure 19:
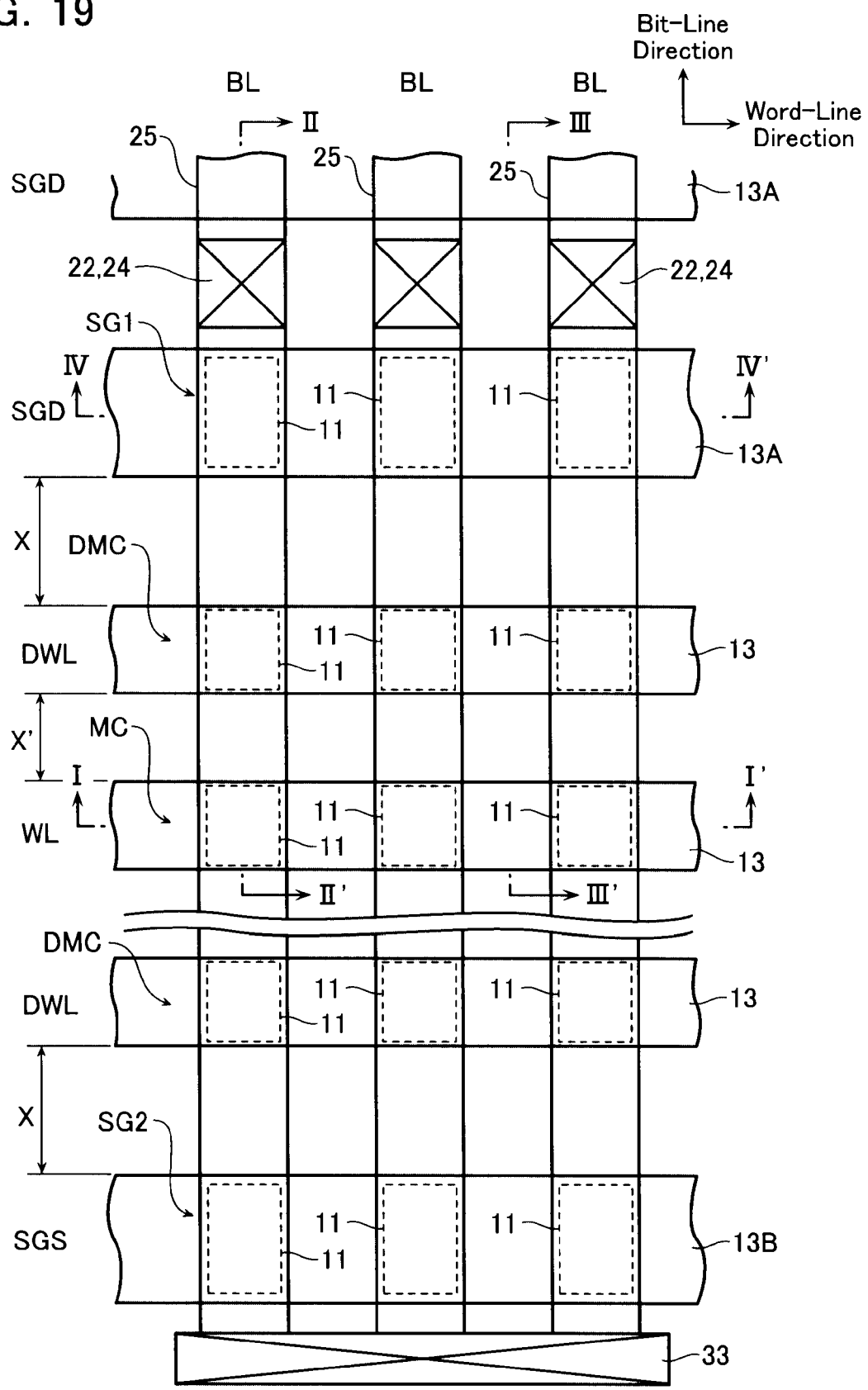
FIG. 19 illustrates a schematic layout of a memory cell array of the NAND-type flash memory according to a fourth embodiment of the present invention.

Referring now to FIGS. 16 to 18, a third embodiment of the present invention will be described below. The configuration of the memory cell array part of this embodiment is the same as that of the above-described embodiments (FIGS. 1 and 2) regarding the structures of the plane layout and the section I-I'. However, the structures of sections II-II' and III-III' are different from the above embodiments.

Specifically, as can be seen from the section II-II' of FIG. 16, the difference from the above embodiments is that diffusion regions 32 are formed neither in the drain contact diffusion regions 15', nor at those parts of the source/drain diffusion regions 15 that are shared between a select gate transistor SG1 and a memory cell MC. That is, a diffusion region 32 is only formed in a part of a source/drain diffusion region 15 between a memory cell MC and a select gate transistor SG1 on the side close to the memory cell MC (the left side), and is not formed on the side close to the select gate transistor SG1 (the right side). Furthermore, the diffusion region 32 is not in contact with the channel of the select gate transistor SG1. Additionally, as indicated by the broken line B4 of FIG. 16, and as can be seen from FIG. 17, the top surface of a device isolation/insulation film 4 within an area P17 encompassing the drain contact diffusion region 15' and the select gate transistor SG1 in their entirety is made higher than that within the other area. In other words, the device isolation/insulation film 4 is not etched back within the area P17, while being etched back in the other area including the memory cells MC and the source-side select gate transistor SG2.

This configuration may be obtained by, as illustrated in FIG. 18, forming a mask M to cover the entire parts of select gate lines SGD and drain contact diffusion regions 15'. Other manufacturing steps may be substantially the same as those described in FIGS. 5 to 10B.

This embodiment may offer the same advantages as the first and second embodiments. Additionally, it is possible to prevent diffusion layers 32 from being formed in the channel regions of select gate transistors SG1 since the select gate line SGD is completed covered with the mask M. That is, if any diffusion layers 32 are formed in the channel regions of the select gate transistors SG1, then the select gate transistors SG1 would have variations in threshold voltage depending on the positions of the ends of the diffusion layers 32. Therefore, the select gate line SGD may be completely covered with the mask M to suppress variations in threshold voltage of the select gate transistor SG1. In addition, formation of p-type diffusion layers 32 in the select gate transistor SG1 could increase the amount of so-called GIDL currents as well as the possibility of erroneous write and so on. However, according to this embodiment, generation of such GIDL currents is suppressed since p-type diffusion layers 32 are not formed immediately below the select gate transistor SG1. Therefore, this may reduce the possibility of writing error of write-inhibited memory cells in the writing operation, or, conversely, erasing error of memory cells in the erase operation.

[Fourth Embodiment]

Referring now to FIGS. 19 to 22, a fourth embodiment of the present invention will be described below. The configuration of the memory cell array part of this embodiment is the same as that of the above-described embodiments (FIGS. 1 and 2) regarding the structures of the plane layout and the section I-I'. However, the structures of sections II-II' and III-III' are different from the above embodiments.

Additionally, in this embodiment, those memory transistors adjacent to the select gate transistors SG1 and SG2 are dummy transistors (dummy cells) DMC that are not used for data storage, and those word lines adjacent to the select gate lines SGD and SGS are dummy word lines DWL that are connected to the dummy transistors DMC.

When data is read from a memory string having such dummy transistors DMC, it is preferable that the data can be read accurately without applying a large read pass voltage to the dummy word lines DWL of the dummy transistors DMC. That is, it is more preferable that the dummy transistors DMC have a lower threshold voltage. If a large read pass voltage is applied to the dummy word lines DWL, this may increase the apparent threshold voltage of the adjacent memory cell MC, causing an erroneous read operation.

Figure 20:
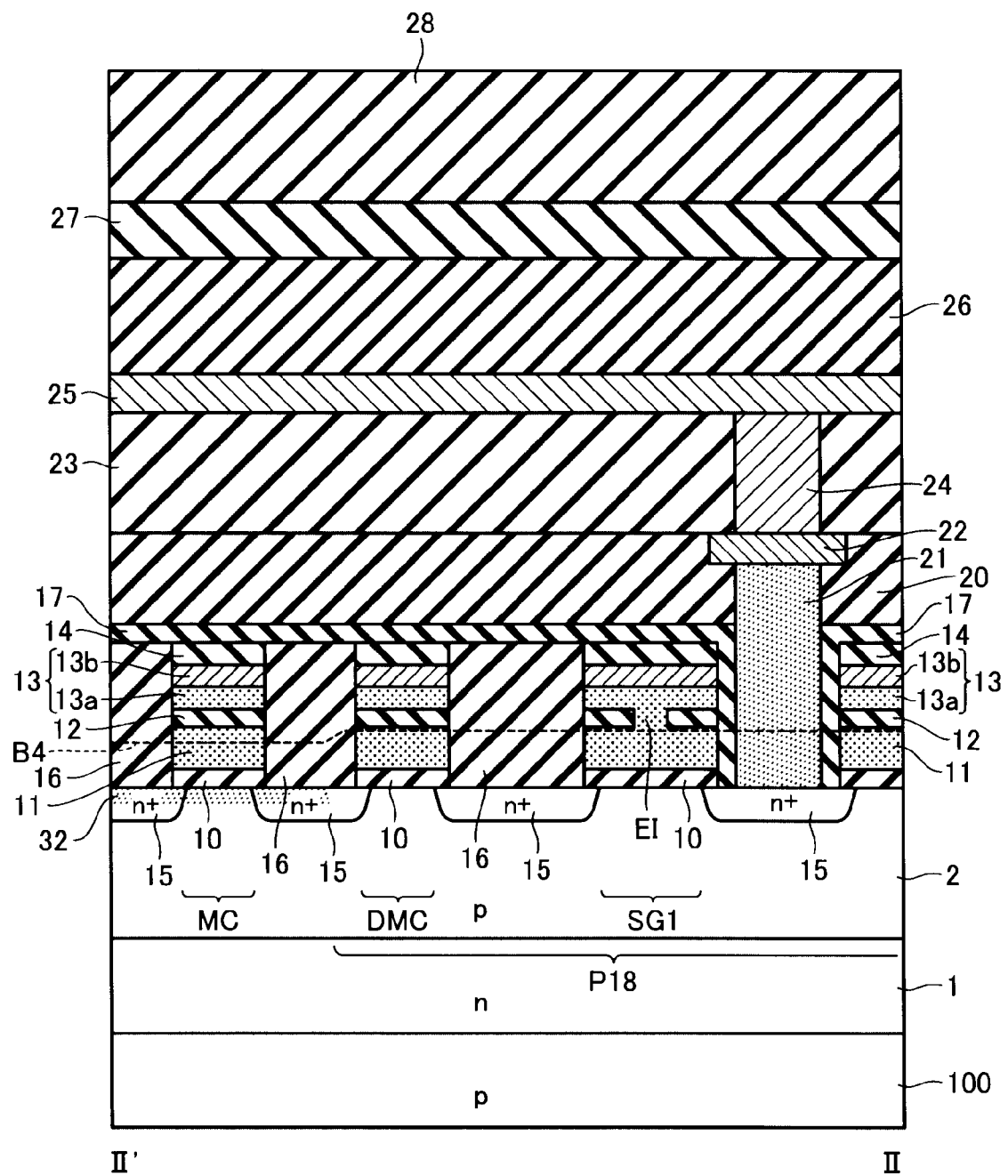
FIG. 20 is a cross-sectional view taken along line II-II' of FIG. 1 for the NAND-type flash memory of the fourth embodiment of the present invention.
Figure 21:
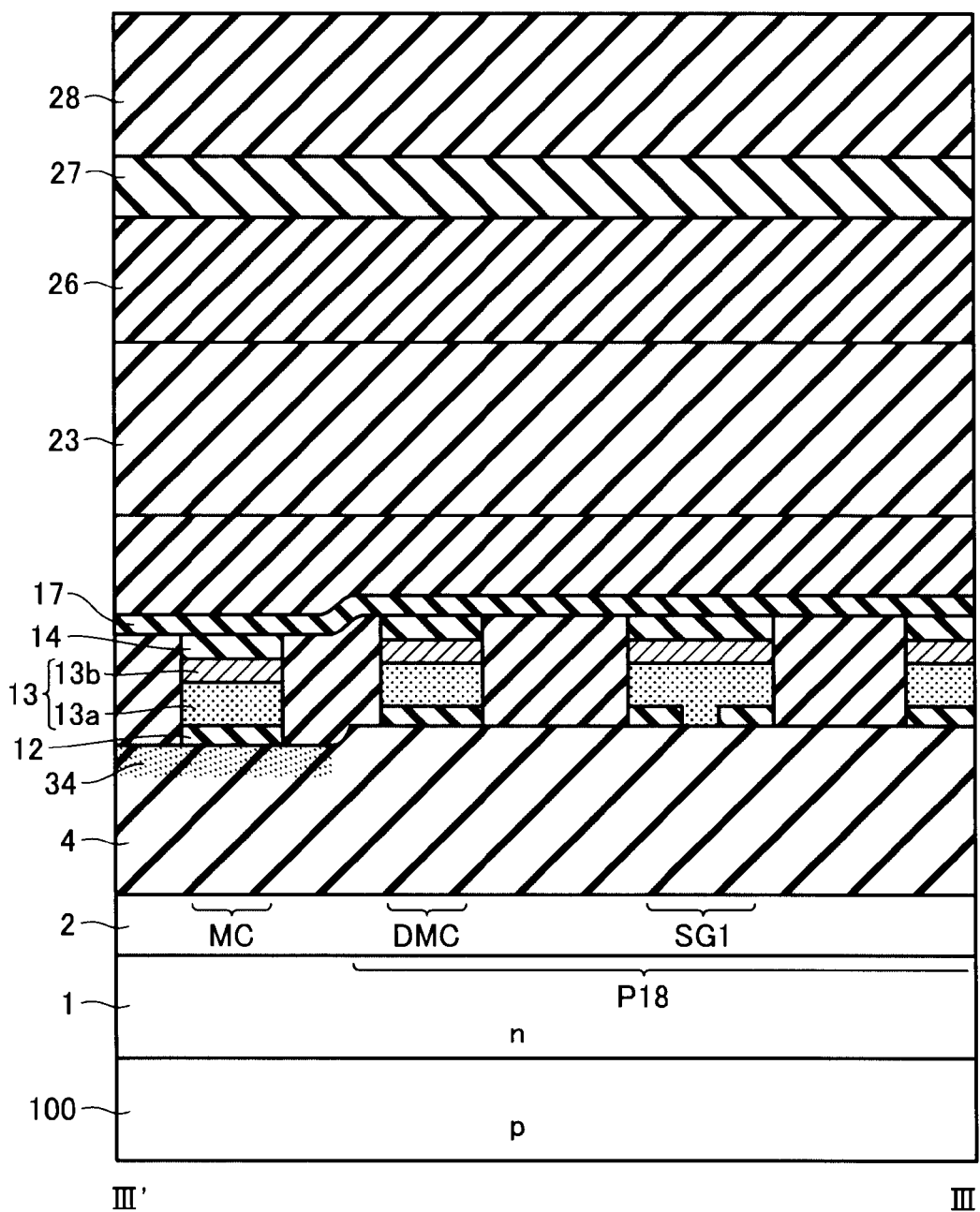
FIG. 21 is a cross-sectional view taken along line III-III' of FIG. 1 for the NAND-type flash memory of the fourth embodiment of the present invention.

Thus, it is preferable that the above-mentioned diffusion regions 32 are not formed immediately below the dummy transistors DMC in order to reduce the threshold voltage of the dummy transistors DMC. To this end, in this embodiment, the device isolation/insulation films 4 are not etched back at the positions of the dummy transistors DMC. As such, the top surfaces of the device isolation/insulation films 4 within an area P18 including the positions where the dummy transistors DMC are formed are made higher than the top surfaces on the side close to other normal (being used for data storage) memory transistors MC (see FIGS. 20 and 21). Thus, as illustrated in FIG. 20, diffusion regions 32 are formed neither in the regions where drain contact diffusion regions 15' and select gate transistors SG1 are formed, nor in the regions where dummy transistors DMC are formed. The diffusion regions 32 are only formed in those regions where normal memory transistors MC and source-side select transistors SG2 are formed.

Figure 22:
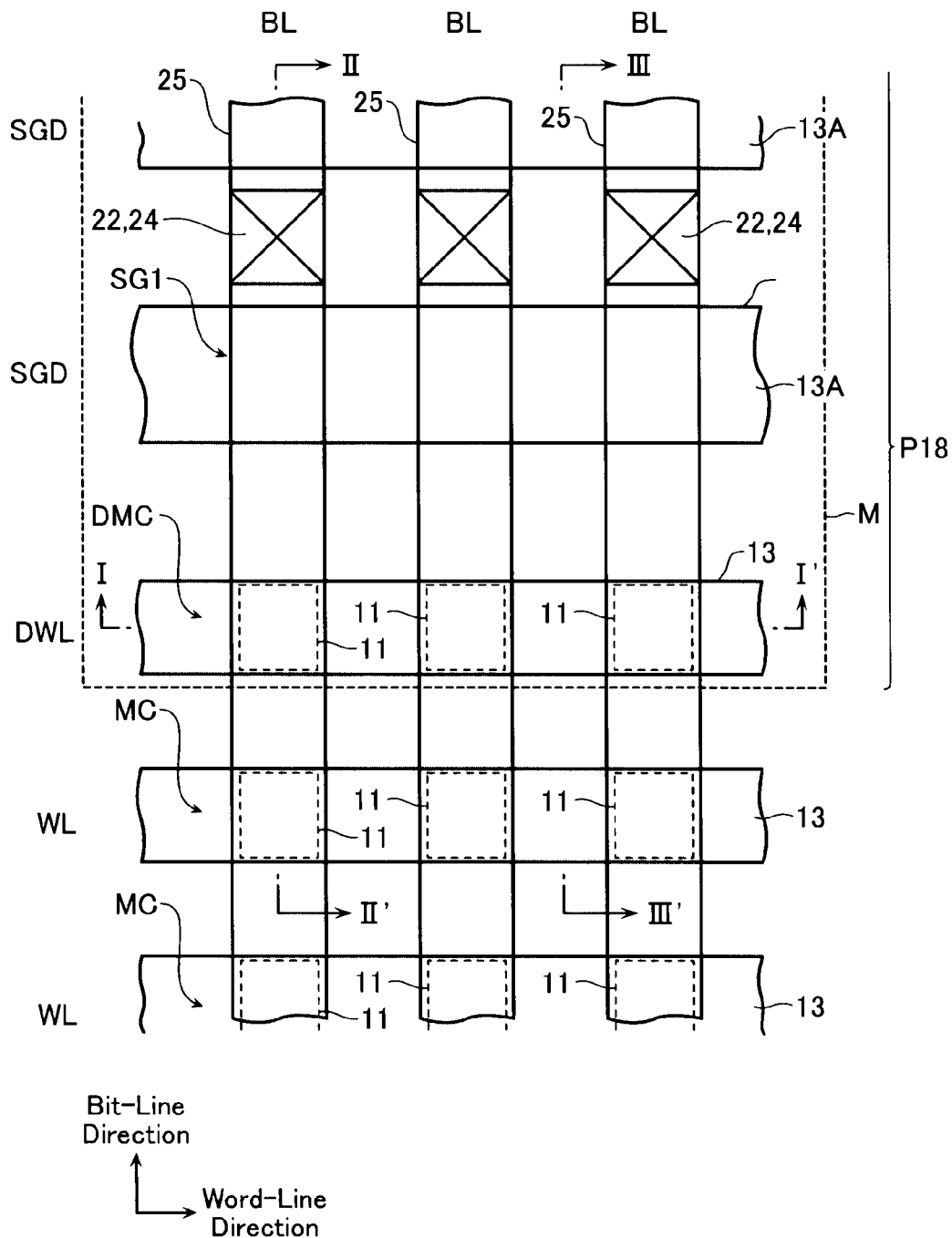
FIG. 22 illustrates a manufacturing process of the semiconductor storage device of the fourth embodiment.

This configuration may be obtained by, as illustrated in FIG. 22, forming a mask M to cover the entire parts of the select gate lines SGD and the drain contact diffusion regions 15' as well as the entire region where the dummy word line DWL is to be formed. Other manufacturing steps may be substantially the same as those described in FIGS. 5 to 10B.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, while the first to fourth embodiments have the boundaries of the masks M at different positions, any forms maybe included within the scope of the invention that have the boundary of a mask M set at any position between the boundaries of the masks M specifically illustrated in these embodiments as long as the drain contact diffusion region 15' is covered with the mask M.

Figure 23A:
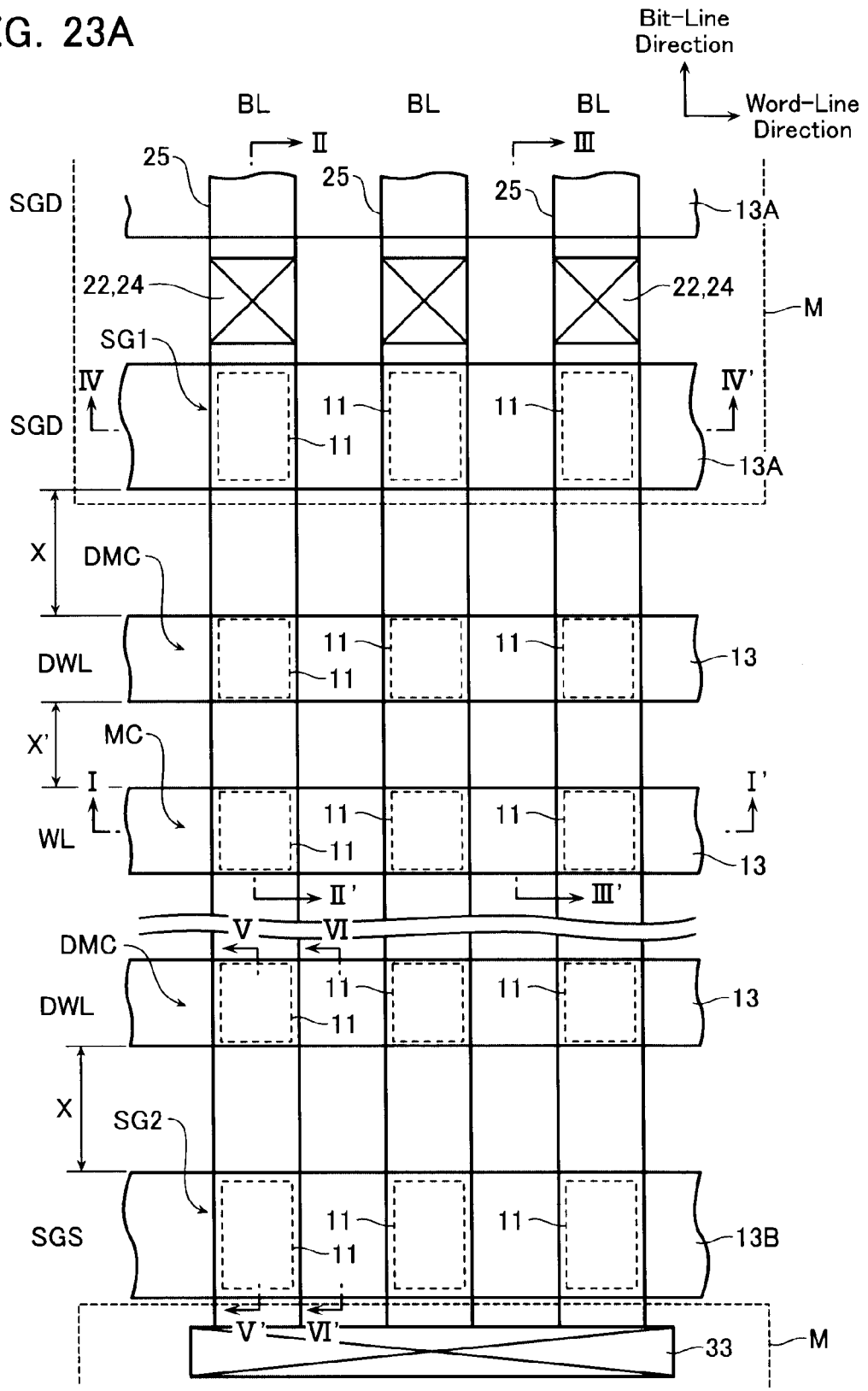
FIG. 23A illustrates a variation of the embodiments.
Figure 23B:
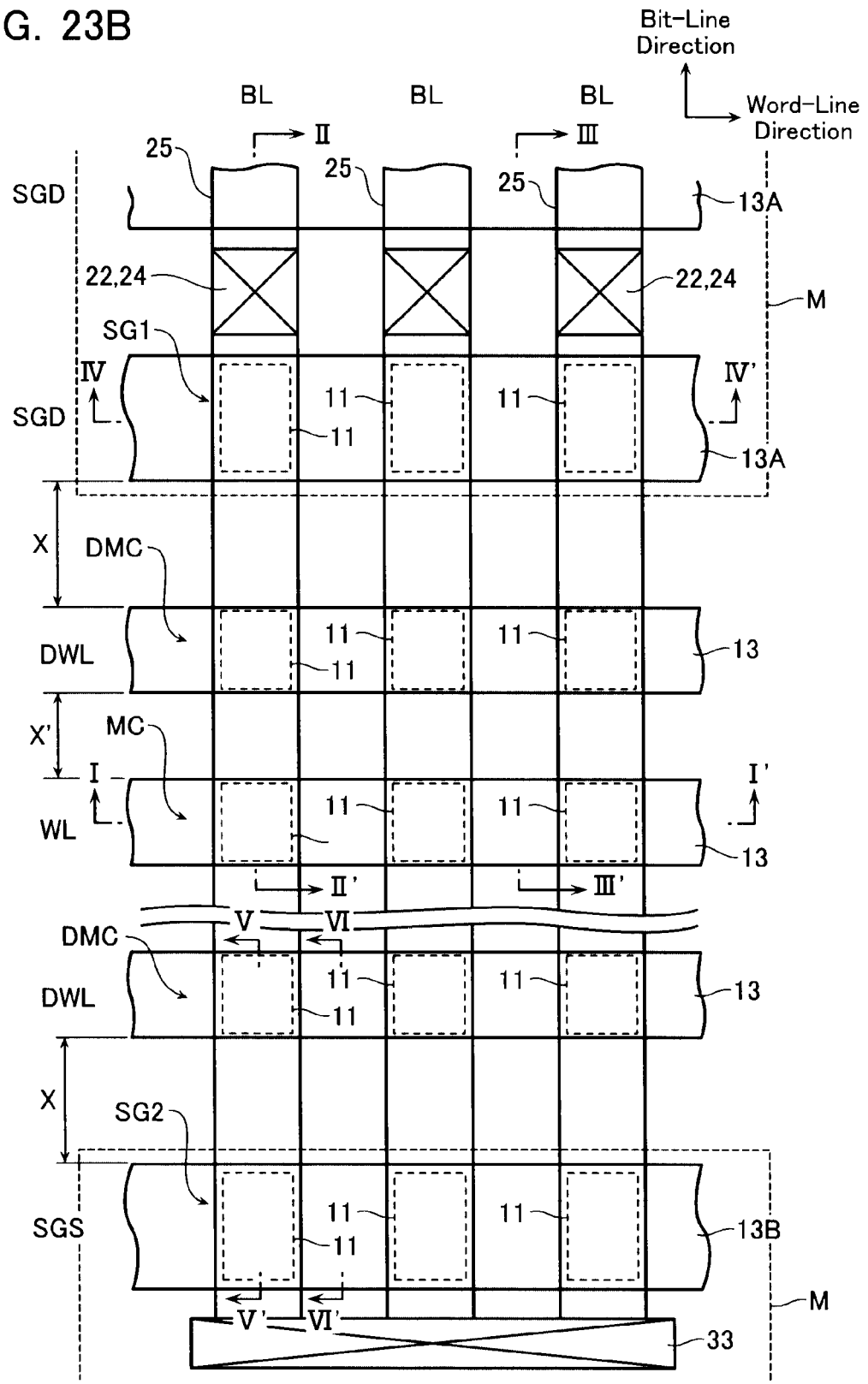
FIG. 23B illustrates a variation of the embodiments.
Figure 23C:
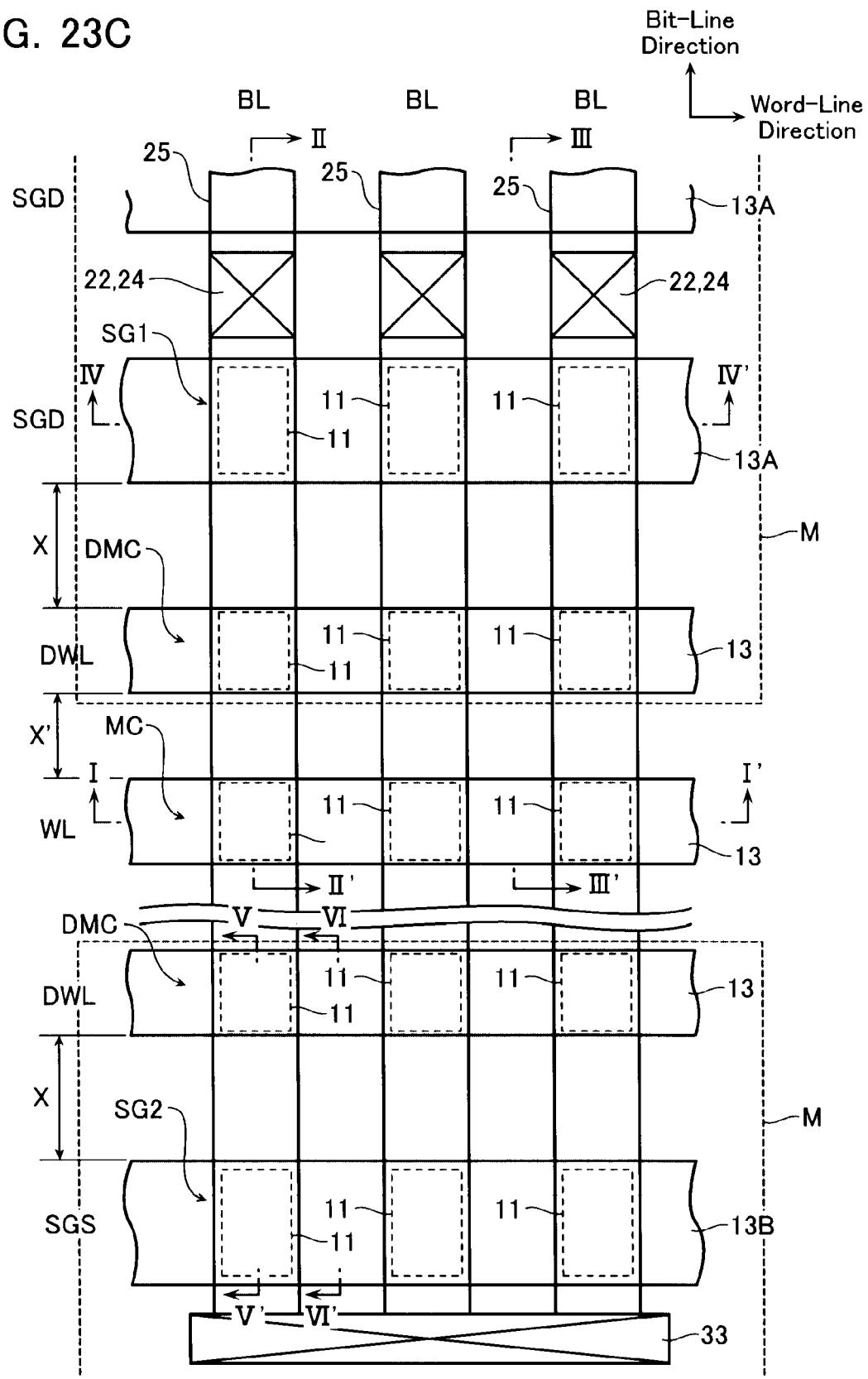
FIG. 23C illustrates a variation of the embodiments.
Figure 24:
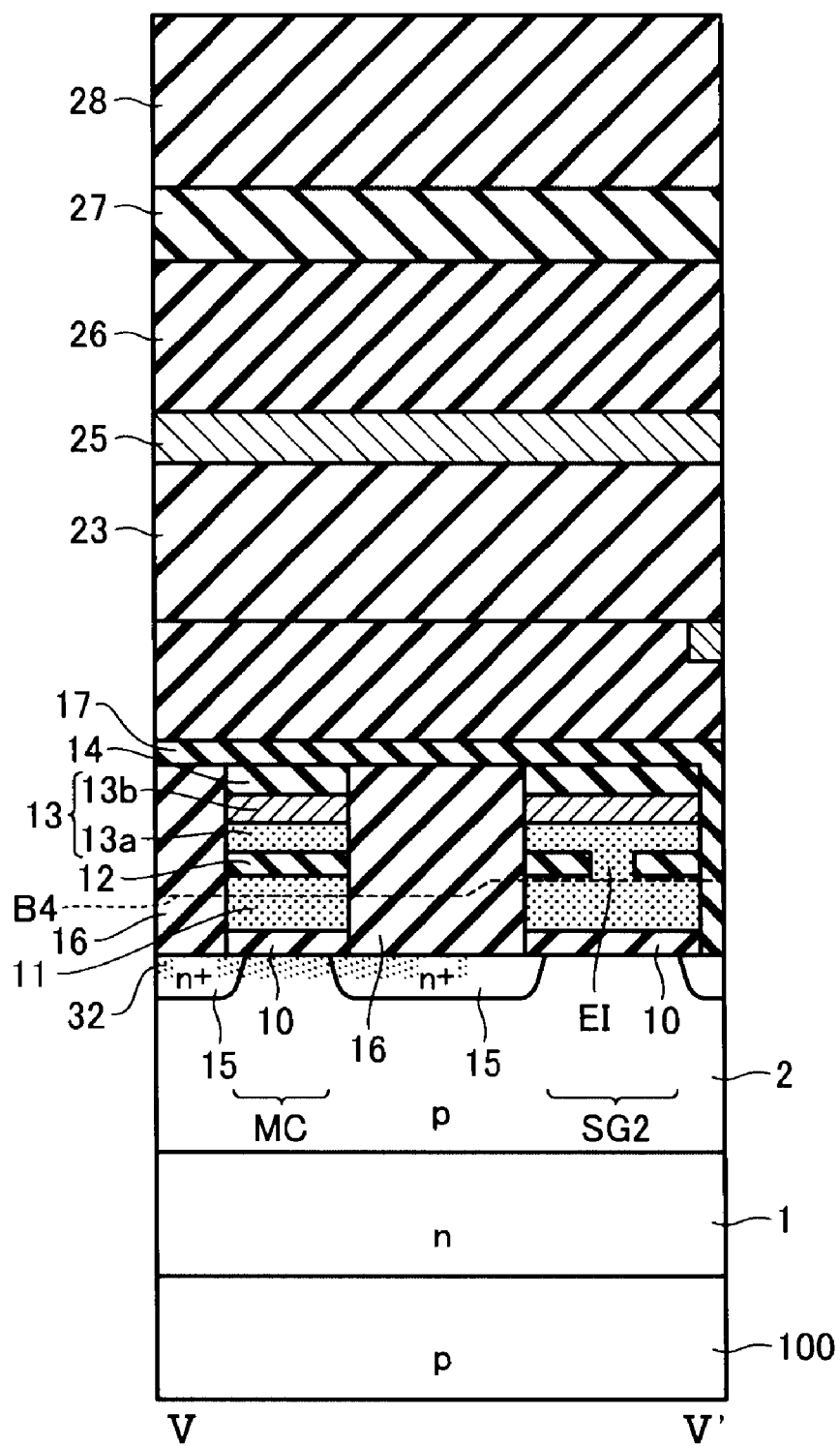
FIG. 24 illustrates a variation of the embodiments.
Figure 25:
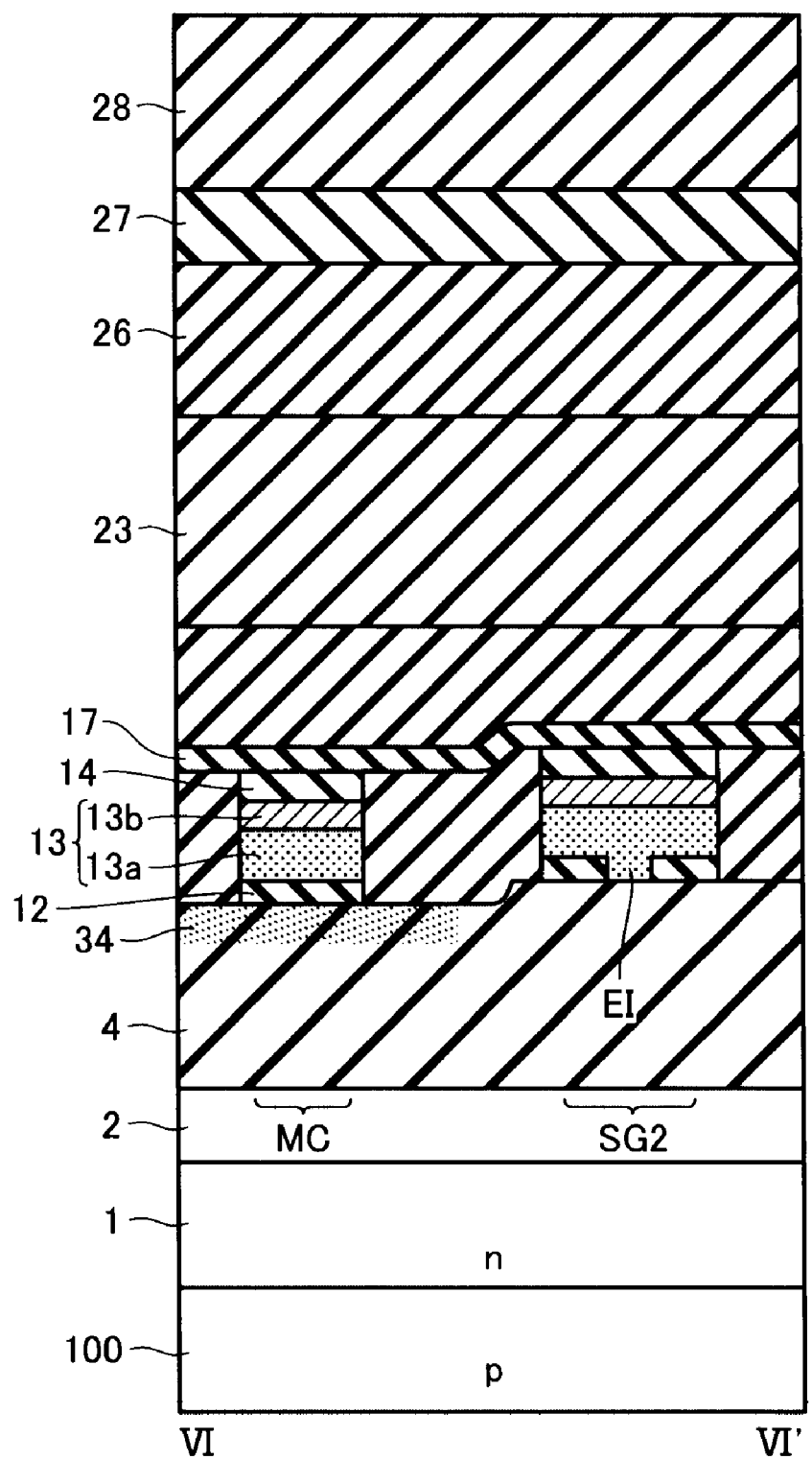
FIG. 25 illustrates a variation of the embodiments.

In addition, in the above-described embodiments, a device formation region 2A including a drain contact diffusion region 15', as well as a device isolation/insulation film 4 at the position of the drain contact diffusion region 15' are covered with a mask M. Accordingly, at least the device isolation/insulation film 4 adjacent to the drain contact diffusion region 15' is not etched back to prevent diffusion regions 32 from being formed at least in the drain contact diffusion region 15'. However, the fourth embodiment may prevent formation of diffusion regions 32 not only in the drain contact diffusion region 15', but also in a source contact diffusion region (not illustrated) in contact with a source-side contact 33. In this case, as illustrated in FIG. 23A, a mask M may be formed to cover the source contact diffusion region. Alternatively, not only the source contact diffusion region, but also source-side select gate transistors SG2 may be covered with a mask M as illustrated in FIG. 23B. Alternatively, in addition to this, dummy memory cells DMC at the source side may also be covered with a mask M as illustrated in FIG. 23C. In the case of FIG. 23A, the device isolation/insulation films 4 in contact with the source contact diffusion region are not etched back, and diffusion regions 32 are not formed at a position where the source contact diffusion region is to be formed (as illustrated in the cross-sectional views of FIGS. 24 and 25). In the case of FIG. 23B, diffusion regions 32 are also not formed at source-side select gate transistors SG2, which may suppress the variations in threshold voltage of the select gate transistor SG2. In the case of FIG. 23C, diffusion regions 32 are not even formed at dummy cells DMC, which may suppress an increase in threshold voltage of the dummy cells DMC.

FIGS. 26 to 29 each illustrate the result of simulating the distribution of impurity concentration in a device formation region 2A provided by a self-manufactured simulator when performing the manufacturing methods of the first, third, and fourth embodiments and of a comparative example, respectively. It should be noted here that the comparative example (FIG. 29) represents the simulation result where a mask M is not formed within the area P15', and thus the device isolation/insulation film 4 has the same height across the entire area. For convenience, it is assumed in FIG. 26 that the boundary of the area P15' is located in the middle section of the select gate transistor SG1.

In this case, concentration curves A, B, C, D of FIGS. 26 to 29 each indicate a concentration curve of a certain impurity concentration. The regions within each concentration curve have an equal impurity concentration. The impurity concentration within the concentration curve A is larger than that within the concentration curve B. In addition, the concentration curve D represents an impurity concentration even smaller than the concentration curve C.

Figure 26:
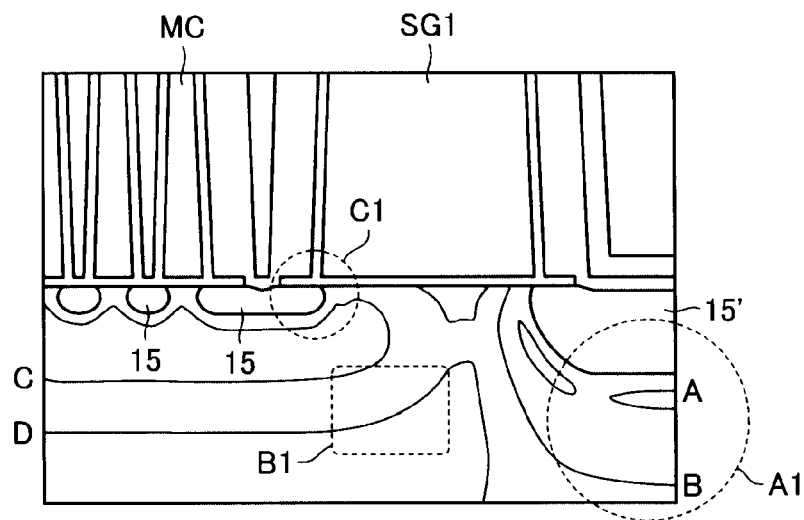
FIG. 26 illustrates a result of simulating the distribution of impurity concentration in a device formation region 2A that is obtained when performing the manufacturing method of the first embodiment.
Figure 29:
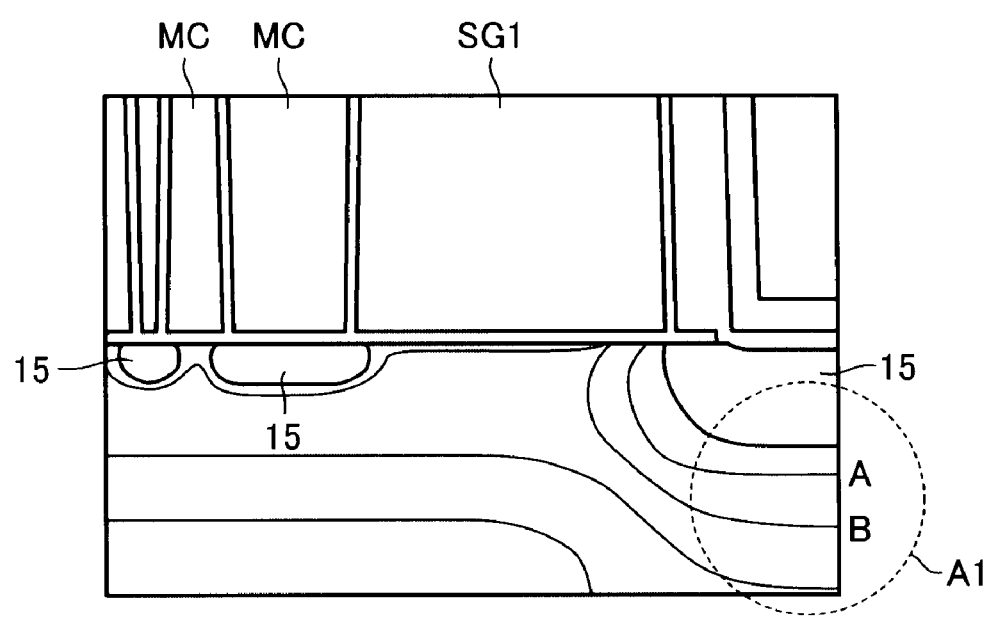
FIG. 29 illustrates a result of simulating the distribution of impurity concentration in a device formation region 2A that is obtained when performing the manufacturing method of a variation.

Referring first to FIGS. 26 and 29, a comparison is made between areas Al, each of which includes an end of a drain contact diffusion region 15' on the side close to the select gate transistor SG1. A distance from the boundary of the drain contact diffusion region 15' to the line B in the area A1 of FIG. 26 is larger than that in the area Al of FIG. 29. That is, as compared with the comparative example, the first embodiment has a gentle slope of impurity concentration at the boundary of the drain contact diffusion region 15'. This may result in a reduction in junction leakage from the drain contact diffusion region 15' to the semiconductor substrate.

Figure 27:
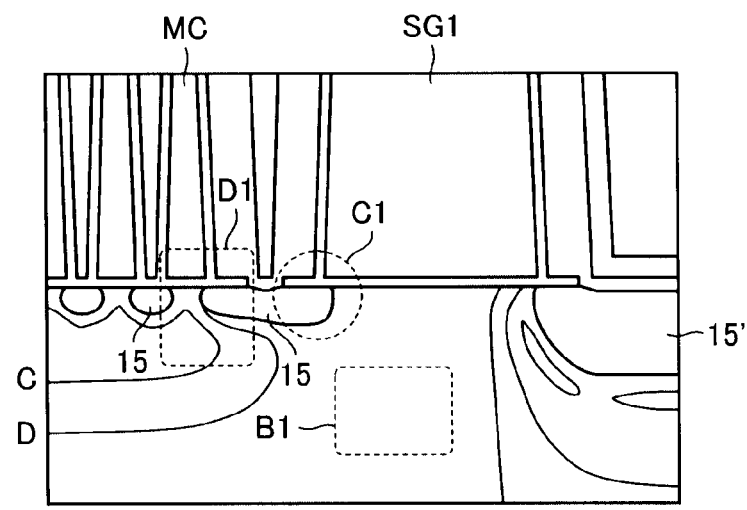
FIG. 27 illustrates a result of simulating the distribution of impurity concentration in a device formation region 2A that is obtained when performing the manufacturing method of the third embodiment.

Referring next to FIGS. 26 and 27, a comparison is made between areas B1, each of which corresponds to an area immediately below the select gate transistor SG1. As can be seen, multiple concentration curves pass through the area B1 and a slope of impurity concentration is present within the area B1 of FIG. 26. In contrast, concentration curve does not pass through the area B1 of FIG. 27 and the distribution of impurity concentration is substantially constant. That is, the third embodiment may further reduce variations in threshold voltage of the select gate transistor SG1 as compared with the first embodiment.

Referring now to FIGS. 26 and 27, a comparison is made between impurity concentrations at areas C1, each of which corresponds to a region between a select gate transistor SG1 and a memory cell MC that is located on the side of a diffusion region 15 closer to the select gate transistor SG1. The concentration curves C and D are approaching the area C1 in FIG. 26, whereas the concentration curves C and D are spaced from the area C1 in FIG. 27. Accordingly, a depletion layer in FIG. 27 that extends from the area C1 to the semiconductor substrate is larger than a depletion layer in FIG. 26 that extends from the area C1 to the semiconductor substrate. That is, the third embodiment may reduce GIDL currents in unselected memory cell strings during a write operation as compared with the first embodiment.

Figure 28:
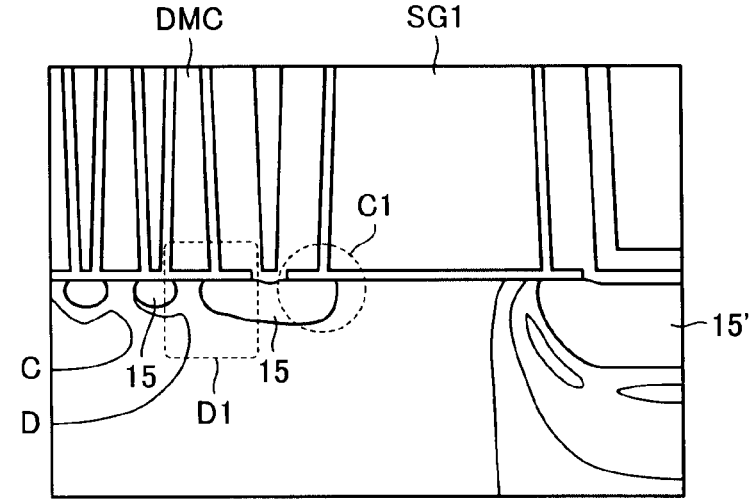
FIG. 28 illustrates a result of simulating the distribution of impurity concentration in an device formation region 2A that is obtained when performing the manufacturing method of the fourth embodiment.

Next, in FIGS. 27 and 28, a comparison is made between areas D1, each of which is located between a select gate transistor SG1 and a memory cell MC (a dummy cell DMC) and includes an end of a diffusion region 15 on the side close to the memory cell MC. In FIG. 27, the channel region of the dummy cell DMC within the area D1 has an impurity concentration between the concentration curves C and D. In contrast, in FIG. 28, the channel region of the dummy cell DMC has an impurity concentration even smaller than the concentration curve D, not between the concentration curves C and D. Therefore, in the case of FIG. 28, it is possible to reduce the impurity concentration at the channel region of the dummy cell DMC as compared with the case of FIG. 27. Conventionally, a threshold voltage of a dummy cell DMC tends to be higher than a threshold voltage of a memory cell MC. However, according to the fourth embodiment, a threshold voltage of a dummy cell DMC may be substantially the same as a threshold voltage of a memory cell MC. Consequently, a pass voltage of a dummy cell DMC at the time of a read operation (i.e., a voltage at which memory cell transistors turn on irrespective of the amount of electric charges accumulated in the memory cells MC) may be the same as a pass voltage of the other memory cells MC. This may simplify the circuit operation and achieve faster read operations.

What is claimed is:

1. A non-volatile semiconductor storage device comprising:
   a semiconductor substrate;
   a semiconductor layer disposed on the semiconductor substrate;
   device isolation/insulation films disposed in the semiconductor layer along a first direction as its longitudinal direction;
   device formation regions configured to separate the semiconductor layer with the device isolation/insulation films along the first direction as its longitudinal direction;
   a memory string including a plurality of memory transistors connected in series and disposed on each of the device formation regions;
   a select gate transistor having one end connected to the memory string, the select gate transistor being disposed on each of the device formation regions;
   a contact diffusion region connected to the other end of the select gate transistor; and
   a contact contacting with the contact diffusion region; and
   the device isolation/insulation films each having a first height within a first area and a second height higher than the first height within a second area,
   at least the device isolation/insulation films adjacent to the contact diffusion region existing in the second area,
   the device isolation/insulation films adjacent to the memory transistors existing in the first area,
   the device isolation/insulation films being implanted with an impurity of a first conductivity type,
   the device formation regions each having a diffusion region of the first conductivity type, and
   an impurity concentration of the impurity of the first conductivity type in the device formation regions adjacent to the device isolation/insulation films in the second area being lower than an impurity concentration of a first impurity in the diffusion regions of the first conductivity type formed in the device formation regions adjacent to the device isolation/insulation films in the first area.

2. The non-volatile semiconductor storage device according to claim 1, wherein
   a dummy transistor is disposed between one of the memory transistors and the select gate transistors, and the dummy transistor is not used for data storage, and
   the dummy transistor is adjacent to the device isolation/insulation films in the second area.

3. The non-volatile semiconductor storage device according to claim 1, wherein
   the diffusion region of the first conductivity type and the contact diffusion region are formed separately from each other.

4. The non-volatile semiconductor storage device according to claim 1, wherein
   each of the memory transistors comprises a first gate electrode disposed on a channel region via a gate insulation film and accumulating an electric charge, a second gate electrode, and a first intergate insulation film disposed between the first gate electrode and the second gate electrode,
   the select gate transistor comprises a third gate electrode disposed in the same layer as the first gate electrode, a fourth gate electrode disposed in the same layer as the second gate electrode, a second intergate insulation film disposed between the third gate electrode and the fourth gate electrode, and an aperture formed in the second intergate insulation film, and
   the aperture exists in the second area.

5. The non-volatile semiconductor storage device according to claim 4, wherein
   a part of the select gate transistor closer to the memory transistors than the aperture is adjacent to the device isolation/insulation films in the first area.

6. The non-volatile semiconductor storage device according to claim 5, wherein
   the select gate transistor shares a first source-drain diffusion region with the adjacent memory transistor, and
   the first source-drain diffusion region is formed so that at least a part of the first source-drain diffusion region is adjacent to the device isolation/insulation films in the second area and the other part thereof are adjacent to the device isolation/insulation films in the first area.

7. The non-volatile semiconductor storage device according to claim 6, wherein
one of the memory transistors connected to the select gate transistor is a dummy transistor that is not used for data storage, and
the dummy transistor is adjacent to the device isolation/insulation films in the second area.

8. The non-volatile semiconductor storage device according to claim 1, wherein
the diffusion region of the first conductivity type formed in the device formation region is formed by diffusion of the impurity of the first conductivity type from the device isolation/insulation films.

9. A non-volatile semiconductor storage device comprising:
a semiconductor substrate;
a semiconductor layer disposed on the semiconductor substrate;
device isolation/insulation films disposed in the semiconductor layer along a first direction as its longitudinal direction;
device formation regions configured to separate the semiconductor layer with the device isolation/insulation films along the first direction as its longitudinal direction;
a memory string including a plurality of memory transistors connected in series and disposed on each of the device formation regions;
a select gate transistor having one end connected to the memory string, the select gate transistor being disposed on each of the device formation regions;
a contact diffusion region connected to the other end of the select gate transistor; and
a contact contacting with the contact diffusion region,
the device isolation/insulation films each having a first height within a first area and a second height higher than the first height within a second area,
at least the device isolation/insulation films adjacent to the contact diffusion region existing in the second area,
the device isolation/insulation films adjacent to the memory transistors existing in the first area,
the device isolation/insulation films being implanted with an impurity of a first conductivity type, and
the device formation regions each having a diffusion region of the first conductivity type.

10. The non-volatile semiconductor storage device according to claim 9, wherein
a dummy transistor is disposed between one of the memory transistors and the select gate transistors, and the dummy transistor is not used for data storage, and
the dummy transistor is adjacent to the device isolation/insulation films in the second area.

11. The non-volatile semiconductor storage device according to claim 9, wherein
the diffusion region of the first conductivity type and the contact diffusion region are formed separately from each other.

12. The non-volatile semiconductor storage device according to claim 9, wherein
each of the memory transistors comprises a first gate electrode disposed on a channel region via a gate insulation film and accumulating an electric charge, a second gate electrode, and a first intergate insulation film disposed between the first gate electrode and the second gate electrode,
the select gate transistor comprises a third gate electrode disposed in the same layer as the first gate electrode, a fourth gate electrode disposed in the same layer as the second gate electrode, a second intergate insulation film disposed between the third gate electrode and the fourth gate electrode, and an aperture disposed in the second intergate insulation film, and
the aperture exists in the second area.

13. The non-volatile semiconductor storage device according to claim 12, wherein
a part of the select gate transistor closer to the memory transistors than the aperture is adjacent to the device isolation/insulation films in the first area.

14. The non-volatile semiconductor storage device according to claim 13, wherein
the select gate transistor shares a first source-drain diffusion region with the adjacent memory transistor, and
the first source-drain diffusion region is formed so that at least apart of the first source-drain diffusion region is adjacent to the device isolation/insulation films in the second area and the other part thereof are adjacent to the device isolation/insulation films in the first area.

15. The non-volatile semiconductor storage device according to claim 14, wherein
one of the memory transistors connected to the select gate transistor is a dummy transistor that is not used for data storage, and
the dummy transistor is adjacent to the device isolation/insulation films in the second area.

16. A method of manufacturing a non-volatile semiconductor storage device, the non-volatile semiconductor storage device comprising:
a memory string and a select gate transistor on a device formation region, a contact diffusion region in the device formation region, the memory string including a plurality of memory transistors connected in series, the select gate transistor having one end connected to one end of the memory string, and the contact diffusion region being connected to the other end of the select gate transistor and in contact with a contact, and
the method comprising:
forming trenches in a semiconductor layer along a first direction as its longitudinal direction, and forming device isolation/insulation films within the trenches to separate the semiconductor layer into a plurality of device formation regions with the device isolation/insulation films;
covering at least a region where the contact diffusion region is to be formed with a mask;
etching back the device isolation/insulation films using the mask;
implanting an impurity into the device isolation/insulation films using the mask; and
diffusing the impurity from the device isolation/insulation films toward the device formation regions through a thermal process.

17. The manufacturing method according to claim 16, wherein
each of the memory transistors comprises a first gate electrode formed on a channel region via a gate insulation film and accumulating an electric charge, a second gate electrode, and a first intergate insulation film formed between the first gate electrode and the second gate electrode,
the select gate transistor comprises a third gate electrode formed in the same layer as the first gate electrode, a fourth gate electrode formed in the same layer as the second gate electrode, a second intergate insulation film formed between the third gate electrode and the fourth gate electrode, and an aperture formed in the second intergate insulation film, and the aperture is formed in a region covered with the mask.

18. The manufacturing method according to claim 17, wherein the mask is formed to cover a part of the select gate transistor ranging from the aperture to the side of the select gate transistor close to the memory transistors.

19. The manufacturing method according to claim 18, wherein the mask is formed to cover a region where the memory transistor connected to the select gate transistor is to be formed.

* * * * *